(12) United States Patent
Wolk et al.

(10) Patent No.: US 12,343,953 B2
(45) Date of Patent: Jul. 1, 2025

(54) NANOSTRUCTURED OPTICAL FILMS AND INTERMEDIATES

(71) Applicant: 3M INNOVATIVE PROPERTIES COMPANY, St. Paul, MN (US)

(72) Inventors: Martin B. Wolk, Woodbury, MN (US); James M. Nelson, Lino Lakes, MN (US); Karl K. Stensvad, Inver Grove Heights, MN (US); Henrik B. van Lengerich, St. Paul, MN (US); Christopher S. Lyons, St. Paul, MN (US); Moses M. David, Woodbury, MN (US); Jeffrey L. Solomon, Vadnais Heights, MN (US); Nicholas C. Erickson, St. Paul, MN (US); Caleb T. Nelson, Woodbury, MN (US)

(73) Assignee: 3M Innovative Properties Company, St. Paul, MN (US)

( * ) Notice: Subject to any disclaimer, the term of this patent is extended or adjusted under 35 U.S.C. 154(b) by 965 days.

(21) Appl. No.: 17/287,141

(22) PCT Filed: Nov. 7, 2019

(86) PCT No.: PCT/US2019/060252
§ 371 (c)(1),
(2) Date: Apr. 21, 2021

(87) PCT Pub. No.: WO2020/097319
PCT Pub. Date: May 14, 2020

(65) Prior Publication Data
US 2021/0389503 A1 Dec. 16, 2021

Related U.S. Application Data

(60) Provisional application No. 62/928,742, filed on Oct. 31, 2019, provisional application No. 62/759,914, (Continued)

(51) Int. Cl.
*B29D 11/00* (2006.01)
*B82Y 20/00* (2011.01)
(Continued)

(52) U.S. Cl.
CPC .. *B29D 11/00788* (2013.01); *B29D 11/00865* (2013.01); *B82Y 20/00* (2013.01);
(Continued)

(58) Field of Classification Search
None
See application file for complete search history.

(56) References Cited

U.S. PATENT DOCUMENTS

| 4,374,077 A | 2/1983 | Kerfeld |
| 4,576,850 A | 3/1986 | Martens |

(Continued)

FOREIGN PATENT DOCUMENTS

| WO | WO 2008/083304 | 7/2008 |
| WO | 2011052611 A1 | 5/2011 |

(Continued)

OTHER PUBLICATIONS

International Search Report for PCT International Application No. PCT/US2019/060252, mailed on Apr. 9, 2020, 3 pages.

*Primary Examiner* — Laura C Powers

(57) ABSTRACT

Nanostructured articles, materials for the nanostructured articles, and intermediate articles for use in making the nanostructured articles. The nanostructured articles can be formed on a flexible film and are useful for optical metasurface applications and possibly other applications. The articles can include nanoreplicated layers or pattern transfer layers of engineered nanostructures.

5 Claims, 17 Drawing Sheets

Related U.S. Application Data filed on Nov. 12, 2018, provisional application No. 62/757,864, filed on Nov. 9, 2018.

(51) Int. Cl.
*B82Y 40/00* (2011.01)
*G02B 1/00* (2006.01)
*G02B 5/02* (2006.01)
*G02B 5/20* (2006.01)

(52) U.S. Cl.
CPC .............. *B82Y 40/00* (2013.01); *G02B 1/002* (2013.01); *G02B 5/0268* (2013.01); *G02B 5/208* (2013.01); *G02B 2207/101* (2013.01)

(56) References Cited

U.S. PATENT DOCUMENTS

| | | |
|---|---|---|
| 4,847,137 A | 7/1989 | Kellen et al. |
| 5,175,030 A | 12/1992 | Lu et al. |
| 5,691,846 A | 11/1997 | Benson, Jr. et al. |
| 5,811,183 A | 9/1998 | Shaw et al. |
| 6,045,864 A | 4/2000 | Lyons et al. |
| 6,719,915 B2 | 4/2004 | Willson et al. |
| 7,074,463 B2 | 7/2006 | Jones et al. |
| 7,173,778 B2 | 2/2007 | Jing et al. |
| 7,858,528 B2 | 12/2010 | Sreenivasan |
| 7,947,608 B2 | 5/2011 | Sreenivasan |
| 7,981,986 B2 | 7/2011 | Hunt et al. |
| 8,034,452 B2 | 10/2011 | Padiyath et al. |
| 8,263,129 B2 | 9/2012 | DeSimone et al. |
| 8,658,248 B2 | 2/2014 | Anderson et al. |
| 8,703,232 B2 | 4/2014 | Stay et al. |
| 8,808,811 B2 | 8/2014 | Kolb et al. |
| 8,986,812 B2 | 3/2015 | Hunt et al. |
| 9,718,961 B2 | 8/2017 | Corveleyn et al. |
| 9,790,396 B2 | 10/2017 | Klun et al. |
| 9,910,192 B2 | 3/2018 | Hao et al. |
| 2005/0150864 A1 | 7/2005 | Stasiak et al. |
| 2007/0298176 A1* | 12/2007 | DiPietro ............. C08F 216/125 427/355 |
| 2009/0015757 A1 | 1/2009 | Potts et al. |
| 2010/0178620 A1 | 7/2010 | Dei et al. |
| 2012/0152887 A1 | 6/2012 | Lee et al. |
| 2013/0211310 A1 | 8/2013 | Bommarito et al. |
| 2015/0214405 A1 | 7/2015 | Nachtigal et al. |
| 2016/0211425 A1 | 7/2016 | Tsujimoto et al. |
| 2017/0293371 A1 | 10/2017 | Yao et al. |

FOREIGN PATENT DOCUMENTS

| | | |
|---|---|---|
| WO | WO 2017/091738 | 6/2017 |
| WO | WO 2018/080830 | 5/2018 |
| WO | WO 2019/032635 | 2/2019 |
| WO | WO 2020/095258 | 5/2020 |

\* cited by examiner

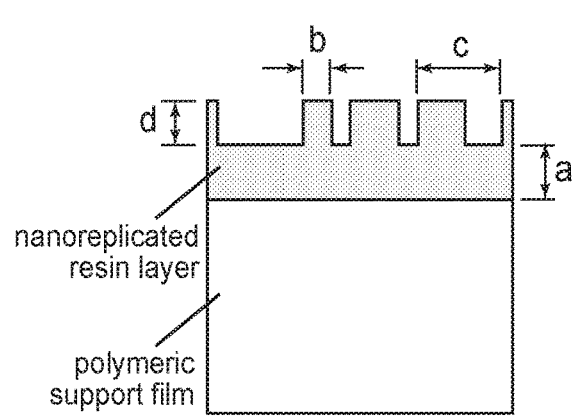
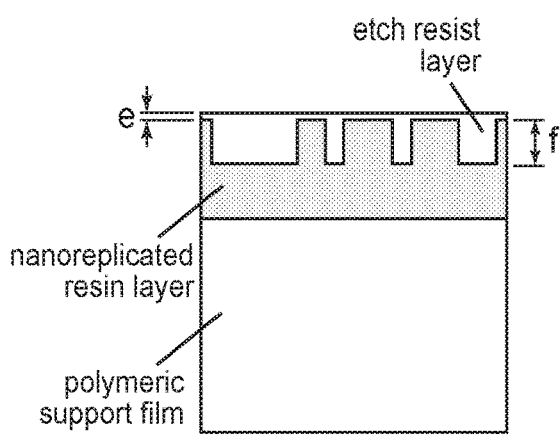
FIG. 1A                    FIG. 1B
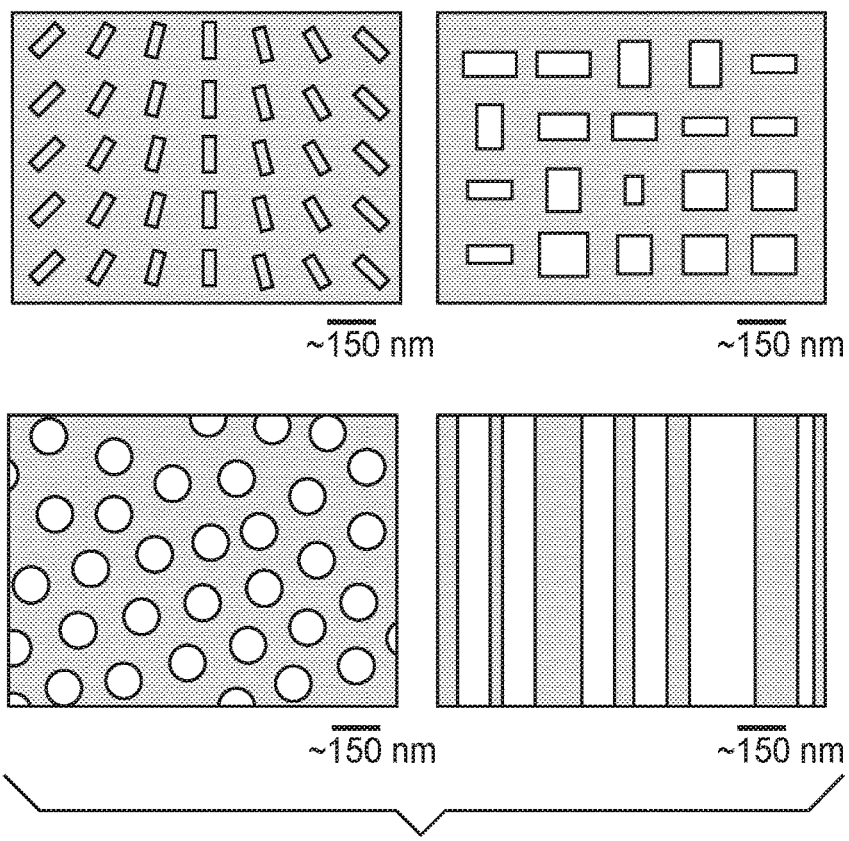
FIG. 2

1.00um 1.00um

NANOSTRUCTURED OPTICAL FILMS AND INTERMEDIATES

CROSS REFERENCE TO RELATED APPLICATIONS

This application is a national stage filing under 35 U.S.C. 371 of PCT/US2019/060252, filed Nov. 7, 2019, which claims the benefit of U.S. Provisional Application Nos. 62/757,864, filed Nov. 9, 2018; 62/759,914, filed Nov. 12, 2018; and 62/928,742, filed Oct. 31, 2019, the disclosures of which are incorporated by reference in their entireties herein.

BACKGROUND

Nanostructured articles and materials for the articles are useful for a variety of optical applications, including optical metasurfaces. A need exists for new nanostructured articles and materials for those structures, particularly for optical metasurface applications.

SUMMARY

Embodiments include nanostructured articles, materials for the nanostructured articles, and intermediate articles for use in making the nanostructured articles.

A first flexible nanostructured optical film includes: a polymeric support film with first and second major surfaces; an etch stop layer adjacent the first major surface of the support film; a nanoreplicated resin layer having a land region and comprising a first surface adjacent the etch stop layer and a second (top) surface further comprising engineered nanostructures characterized by feature dimensions of width, length, and height; and an etch resist layer with a first surface adjacent the second surface of the nanoreplicated resin layer and a second (top) surface. In this first film, the top surface of the engineered nanostructures of the nanoreplicated resin layer is essentially coplanar with the top surface of the etch resist layer.

A second flexible nanostructured optical film includes: a polymeric support film with first and second major surfaces; an etch stop layer adjacent the first major surface of the support film; a nanoreplicated and an etched resin layer having a zero land region height and comprising a first surface adjacent the etch stop layer and a second (top) surface further comprising engineered nanostructures characterized by feature dimensions of width, length, and height; and a backfill layer having a first surface adjacent the second surface of the nanoreplicated resin layer and a second (top) surface. In this second film, the top surface of the backfill layer is essentially planar.

A third flexible nanostructured optical film includes: a polymeric support film with first and second major surfaces; a cladding layer with a first major surface adjacent the first major surface of the support film and a second major surface; an etch stop layer adjacent the second major surface of the cladding layer; a pattern transfer layer comprising a first surface adjacent the etch stop layer and a second (top) surface further comprising engineered nanostructures (vias) characterized by feature dimensions of width, length, and height; and a backfill layer having a first surface adjacent the second surface of the pattern transfer layer and a second (top) surface. In this third film, the top surface of the backfill layer is essentially planar.

A fourth flexible nanostructured optical film includes: a polymeric support film with first and second major surfaces; an etch stop layer adjacent the first major surface of the support film; a pattern transfer layer adjacent the etch stop layer on a side opposite the polymeric support film; and a nanoreplicated resin layer having a land region and comprising a first surface adjacent the pattern transfer layer and a second (top) surface further comprising engineered nanostructures characterized by feature dimensions of width, length, and height.

A fifth flexible nanostructured optical film includes: a pattern transfer layer with first and second major surfaces; an etch stop layer adjacent the first major surface of the pattern transfer layer; a hard mask layer adjacent the etch stop layer on a side opposite the pattern transfer layer; and a nanoreplicated resin layer having a land region and comprising a first surface adjacent the hard mask layer and a second (top) surface further comprising engineered nanostructures characterized by feature dimensions of width, length, and height.

A sixth flexible nanostructured optical film includes: a pattern transfer layer with first and second major surfaces; an etch stop layer adjacent the first major surface of the pattern transfer layer; a hard mask layer adjacent the etch stop layer on a side opposite the pattern transfer layer; a nanoreplicated resin layer having a land region and comprising a first surface adjacent the hard mask layer and a second (top) surface further comprising engineered nanostructures characterized by feature dimensions of width, length, and height; and an etch resist layer with a first surface adjacent the second surface of the nanoreplicated resin layer and a second (top) surface. In this sixth film, the top surface of the engineered nanostructures of the nanoreplicated resin layer is essentially coplanar with the top surface of the etch resist layer.

BRIEF DESCRIPTION OF THE DRAWINGS

FIGS. 1A and 1B show key dimensions of nanostructured films (cross-sectional views).

FIG. 2 illustrates four representative engineered nanopatterned regions (plan views) where raised features correspond to the darker regions, although the darker regions could correspond to lower or depressed features.

DETAILED DESCRIPTION

Figure 3A:
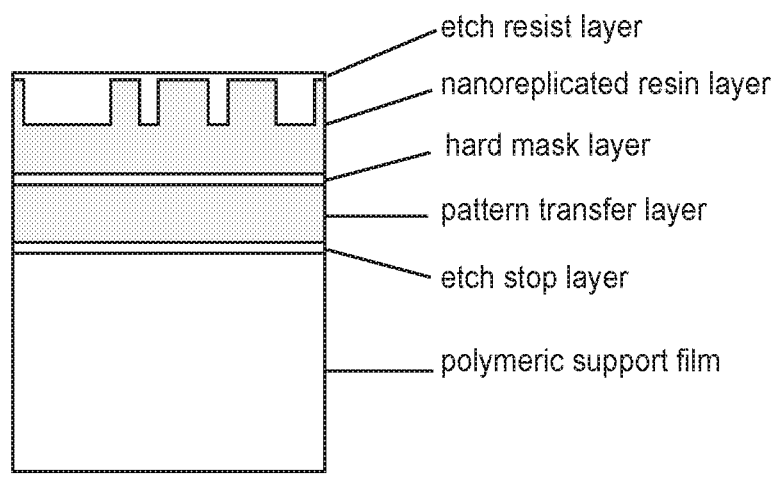
FIGS. 3A and 3B show layers of nanostructured films.
Figure 3B:
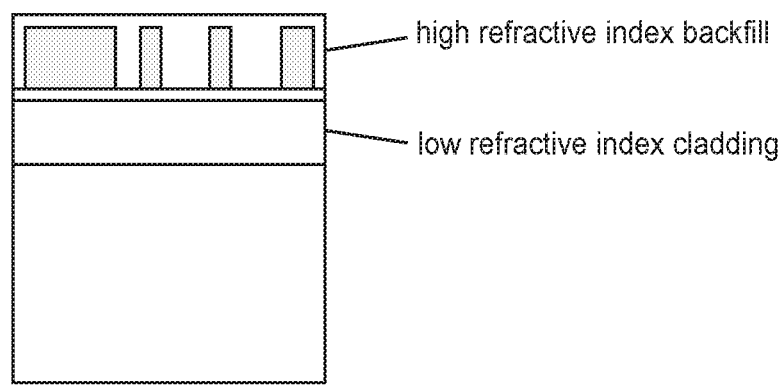

Described herein are several nanostructured intermediate film articles formed during six exemplary process routes to transmissive nanostructured optical films.

The articles described herein are key intermediates or end products based on subwavelength, diffractive, or metamaterial optics. These unique nanopatterned optical film articles and products are designed with high throughput, high fidelity, and roll-to-roll production capability, as opposed to the more commonly used batch approaches via semiconductor wafer lithography and nanoimprint lithography.

Some of the representative nano-feature shapes include, but are not limited to, rectangular, triangular and trapezoidal prisms, fins, cylindrical and truncated-cone shaped pillars, and other such shapes. The features can be placed with regular or randomized pitch, orientation, and shapes, possibly dependent on application functionality and manufacturing requirements.

Definitions engineered nano- and microstructures—Surface features with dimensions ranging from about 10 nm to 1000 μm that were created from a specific design with deterministic position, size, shape, spacing, and dimensions. Four non-limiting examples of binary (single etch depth) engineered nanostructures are shown in FIG. 2.

master template—A silicon or quartz substrate with at least one region of engineered micro- and or nanopatterns etched into a major surface using semiconductor lithography methods such as e-beam lithography, maskless lithography, immersion lithography, or the like.

feature height—The distance from the highest point to the lowest point on an individual surface feature ("d" in FIG. 1A). Some engineered structures may comprise arrays of features with a continuous range or a discrete number of height values (e.g., multi-level designs).

aspect ratio—The ratio of feature height to feature width ("d/b" in FIG. 1A). Some engineered surfaces may comprise features with a range of aspect ratio values such as an array of features with constant height and variable width. In such cases, the surface is usually characterized by the largest aspect ratio value.

nanoreplication—A continuous thermal or photochemical process for creating a structured surface layer using a cylindrical tool and a roll of polymeric support film with a thermoplastic (thermal) or UV-curable resin (photochemical) layer. Nanoreplication can include nanoimprint lithography (NIL).

nanoreplicated resin layer—A layer of material on a support substrate with a surface comprising an array of engineered nano- and/or microstructures created by the nanoreplication process.

land region thickness—The height of a structured surface layer between its bottom surface and the plane defined by the bottom of the surface features ("a" in FIG. 1A). Also referred to as the residual layer or region. In the case where an etch resist layer is used to planarize a nanoreplicated resin layer, the land is the portion of the planarizing layer between the top surface of the resist layer and the plane defined by the top of the surface features of the nanoreplicated resin layer ("e" in FIG. 1B).

precision land—Structured surface layers with a deterministic, controlled land thickness. Two examples are a minimized land that enables subsequent etch steps and a land that will define the feature height in the final film. Ideally, the thickness of the residual layer thickness (a ore in FIG. 1) will be less than the feature height (d or fin FIG. 1) when the structured surface enables subsequent etch steps. When the land thickness defines the height of the features in the final film, the land layer thickness ideally has variability that is <25%, more preferably <10%, and most preferably <5% of the layer thickness.

uncontrolled land—Structured surface layers with an arbitrary land thickness. Layer thickness variability may be >25%.

etch resist layer—A patterned layer of organic, hybrid, or inorganic material used to mask underlying layers during a wet chemical or dry etch process. This layer usually has nanopatterned surface features. Examples include silane acrylates, siloxanes, silicones, and silsesquioxanes.

patterned thin film mask—An etch resist layer deposited by a vacuum deposition technique usually used to mask portions of an inorganic pattern transfer layer (e.g., $TiO_2$) or to create deep trenches or vias in a dry etch step. Thin film mask materials include Diamond-Like Carbon (DLC), Diamond-Like Glass (DLG), amorphous hydrogenated silicon carbide (a-Si:C:H), germanium, aluminum, copper, tungsten, oxides, and carbides of metals.

pattern transfer layer—A layer beneath an etch resist layer that is patterned in a dry etch process. In traditional semiconductor lithography, this layer is used to further etch a layer on a wafer substrate. In this invention, the pattern transfer layer comprises the functional features or the embedding medium for the functional features of an optical film. Since the thickness of the pattern transfer layer defines the feature height of the final article, the layer thickness variability is <25%, <10% or more preferably <5%. In addition, the pattern transfer layer must be transparent and have a refractive index that provides optical contrast in the final embedded optical element.

etch stop layer—An etch resistant layer that is used to define a common etch depth during a wet or dry etch process.

embedded optical element—A set of two layers comprising an optically transparent nanopatterned layer with a refractive index $n_1$ and an optically transparent planarizing layer with a refractive index of $n_2$, where $|\Delta n|>0.20$. More preferably $|\Delta n|>0.25$ or $>0.30$. Although the planarizing layer is referred to as the "high refractive index backfill layer," either layer of the pair can possess the higher index.

polymeric support film—A continuous, flexible polymeric film usually available in roll form that provides mechanical support during roll-to-roll processing of surface coatings (e.g., nanoreplication, reactive ion etching, and vapor deposition).

cladding or auxiliary layer—A layer between the polymer support film and etch stop layer that provides an optical function that augments the performance of the embedded optical element. A non-limiting list of examples include a low refractive index cladding or isolation layer, a diffuser layer, a high refractive index tuning layer, and an antireflection layer.

Layers and Material Properties

TABLE 1

Layers and Typical Material Properties

| Layer Name | Materials | Thickness | R.I. Range | Patent Reference |
|---|---|---|---|---|
| Etch resist layer | Common etch resists contain silicon, for example siloxanes, silicones, silsesquioxanes | Full feature depth + land coating 50-500 nm | N/A | WO2008/083304A2, U.S. Pat. No. 5,811,183 |
| Nanoreplicated resin layer | polymerizable compositions comprising acrylate or methacrylate components (U.S. Pat. No. 4,374,077, U.S. Pat. No. 4,576,850, U.S. Pat. No. 5,175,030, U.S. Pat. No. 5,691,846, U.S. Pat. No. 7,074,463, U.S. Pat. No. 8,986,812) Thermoplastic materials: poly(methyl methacrylate, polycarbonate, polypropylene, polyethylene, polystyrene, polyester, polyamide, | 50 nm-10 μm | 1.4-1.7, 1.45-1.6 | U.S. Pat. No. 8,658,248, U.S. Pat. No. 5,811,183 (F-acrylate), U.S. Pat. No. 6,045,864 |
| Hard mask layer | Si-containing metal oxides including $SiO_2$, $SiAlO_x$. Diamond-like glass, metals such as aluminum, copper, titanium, tungsten, germanium, silicon, etc. | 5-50 nm | N/A | US2015/0214405. U.S. Pat. No. 8,034,452 (diamond like glass) |
| Pattern transfer layer | Low Index Nanoporous coatings, xerogels, and aerogels, perfluoropolyethers, Teflon, LTM, Cytop materials, HFPO, or fluorenol methacrylate | 50-2000 nm | 1.2-1.5 | U.S. Pat. No. 8,808,811, U.S. Pat. No. 7,981,986 |
| | High Index parylenes | | 1.5-1.8 | |
| Etch stop layer | Metals and their oxides and nitrides including oxides or nitrides of Si, Al, Ti, Zr, Ta, Hf, Nb, Ce, and mixtures thereof. Diamond-like glass | Thickness greater than 2 nm | N/A | U.S. Pat. No. 8,034,452 (diamond like glass) |
| Polymeric support film | Polyester, co-polyester, polycarbonate, polyurethane, poly(methyl methacrylate), polystyrene, polyimide, polyethylene napthalate, polyproplyene, polycyclo-olefins, preferred polyester and polycarbonate | 10-250 μm | 1.5-1.7 | U.S. Pat. No. 4,576,850, U.S. Pat. No. 5,175,030, U.S. Pat. No. 7,074,463 |
| High R.I. backfill (coated) | zirconia or titania-filled acrylate resins | Full feature depth and optionally additional thickness up to 100 nm | 1.7-1.85 | |
| High R.I. backfill (vapor deposited) | Metal oxides, nitrides, and oxynitrides including oxides, nitrides, and oxynitrides of Si, Ti, Zr, Hf, Nb, Ta, or Ce | Full feature depth and optionally additional thickness up to 100 nm | 1.8-2.5 | |
| Cladding/ Auxiliary layer | Low Index Nanoporous coatings, xerogels, and aerogels, low-K dielectric thin films perfluoropolyethers, Teflon, LTM, Cytop materials, HFPO, or fluorenol methacrylate | 50 nm-10 μm | 1.1-1.5 | |
| | High Index parylenes | | 1.5-1.8 | |

| # | Description | Advantage(s) | Limitation(s) | Critical added capability |
|---|---|---|---|---|
| | | Process Routes | | |
| Route 1 | Single replicated resist layer with uncontrolled land. | If the feature height uniformity of the surface features in the final article is not critical. There is no etch depth layer, so etch depth will be a function of the etch resist layer vias diameter or trench width. | The etch depth uniformity for features of the same diameter will also vary somewhat both across and down web. | High-aspect ratio features on film |
| Route 2 | Single replicated resist layer with precision land and etch stop layer. | Useful if the feature height uniformity of the surface features in the final article is critical. | Optical features material limited to nanoreplication resins. | Etch-stop layer |
| Route 3 | Replicated resist layer with near zero residual layer and precision pattern transfer layer. | Most direct route for roll-to-roll fabrication of nanopatterned optical films with uniform features having an absolute height value. Articles (320) and (370) differ from the preceding articles (230) and (270) in that the transfer layers for articles (320) and (370) can be selected from a larger array of materials because the transfer layer does not need to be replicated. | High aspect ratio resist features are required. In process 3C, while transfer layer is etched through, resist features have to survive. Resist cannot be a material similar to transfer layer-acrylate (contrast needed). | Near-zero residual layer and Pattern Transfer layer on film |
| Route 4 | Replicated resist layer with near zero residual layer (hard mask layer) and precision pattern transfer layer. | Utilizes a hard mask layer that also functions as a second etch stop layer. The inclusion of a hard mask layer has four beneficial effects. First, it reduces or eliminates the requirement for a near zero residual layer resist replication process since the etch of the thin hard mask layer does not require a high aspect ratio resist feature. Second, the nanoreplicated resist material can be an acrylate resin formulation rather than a silicon-rich hybrid material typically used for R2R NIL. Third, the hard mask etch process enables the formation of deep vias with vertical sidewalls (important for optical metasurface applications). Fourth, the construction allows for the use of a low refractive index pattern transfer layer (e.g., a fluoroacrylate) since the vapor deposition step for the hard mask layer forms a well-adhered layer inorganic layer with good wettability for the nanoreplicated resin layer. | Higher cost/more complexity than route 3. | Hard mask layer |
| Route 5 | Replicated resist layer with uncontrolled land | Eliminates the requirement for a near zero land resist | Expense of additional steps and complexity. | |

Process Routes (continued)

| # | Description | Advantage(s) | Limitation(s) | Critical added capability |
|---|---|---|---|---|
| | and precision pattern transfer layer. | replication process. As with Route 5, it can produce deep vias with vertical sidewalls and employ the use of a fluoroacrylate pattern transfer layer. | | |
| Route 6 | Addition of a low refractive index cladding layer. | | | |

Route 1. Single Replicated Resist Layer with Uncontrolled Land.

Figure 4:
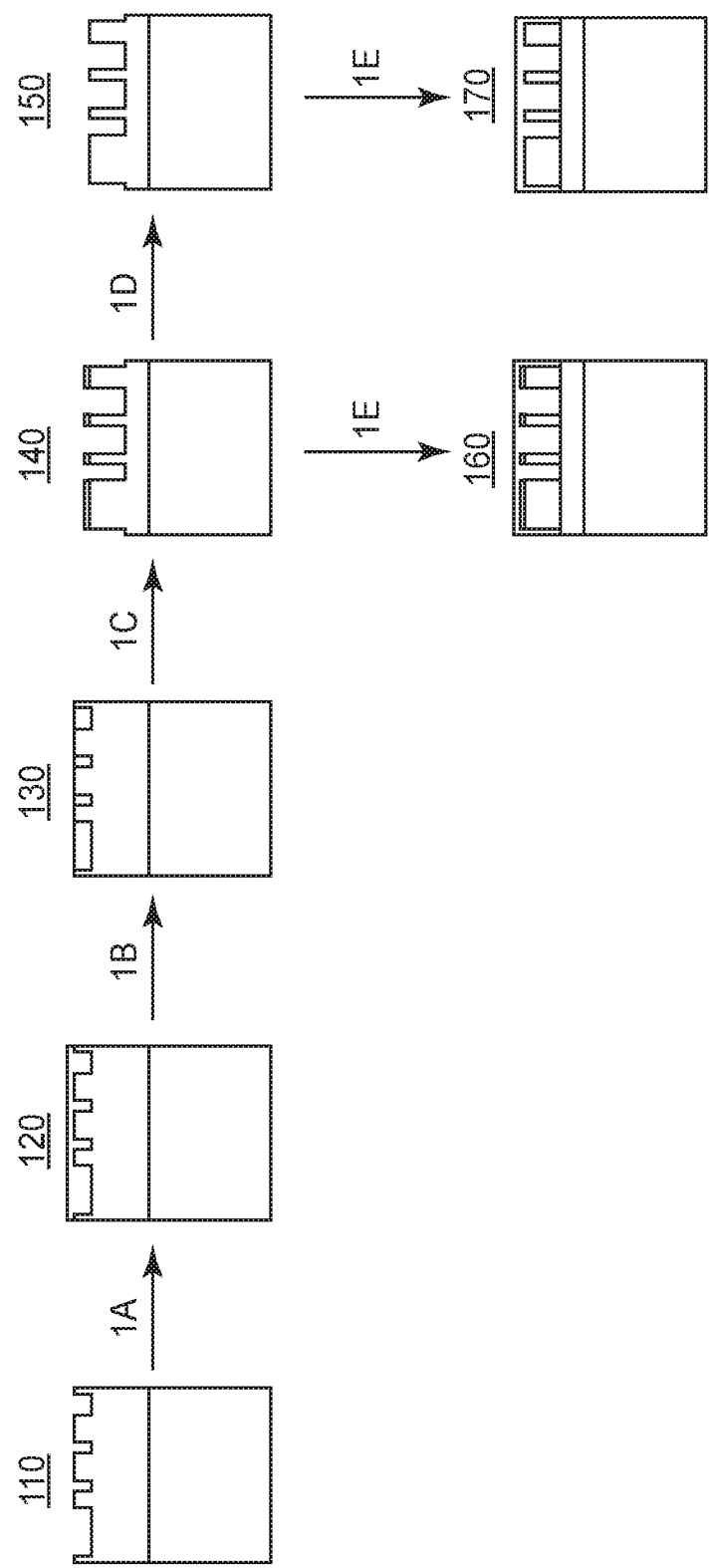
FIG. 4 illustrates a single replicated resist layer with uncontrolled land.

Route 1, shown in FIG. 4, is the simplest of the described routes to nanopatterned optical films. It is useful if the feature height uniformity of the surface features in the final article is not critical. There is no etch depth layer, so etch depth will be a function of the etch resist layer hole diameter or trench width. The etch depth uniformity for features of the same diameter will also vary somewhat both across and down web.

A nanoreplicated film 110 is coated with an etch resist layer so that layer covers and substantially planarizes the surface features of the nanoreplicated resin layer (process 1A, "minimal land resist coating"). Planarized nanoreplicated film 120 is etched in a reactive ion etch (RIE) process until the land has been removed and the top surface of the nanoreplicated surface features have been exposed (process 1B, "breakthrough etch"). Zero land resist coated nanoreplicated film 130 is etched in an RIE process until the desired etch depth has been achieved, leaving some resist residue at the top of each feature (process 1C). Etched nanopatterned film with residue 140 can be either planarized with a high refractive index backfill to form embedded nanopatterned optical film 160 (process 1E) or subjected to different etch conditions to remove the etch resist residue to form unfilled nanopatterned optical film 150 (process 1D). Finally, unfilled nanopatterned optical film 150 can be planarized with a high refractive index backfill to form embedded nanopatterned optical film 170.

Route 2. Single Replicated Resist Layer with Precision Land and Etch Stop Layer.

Figure 5:
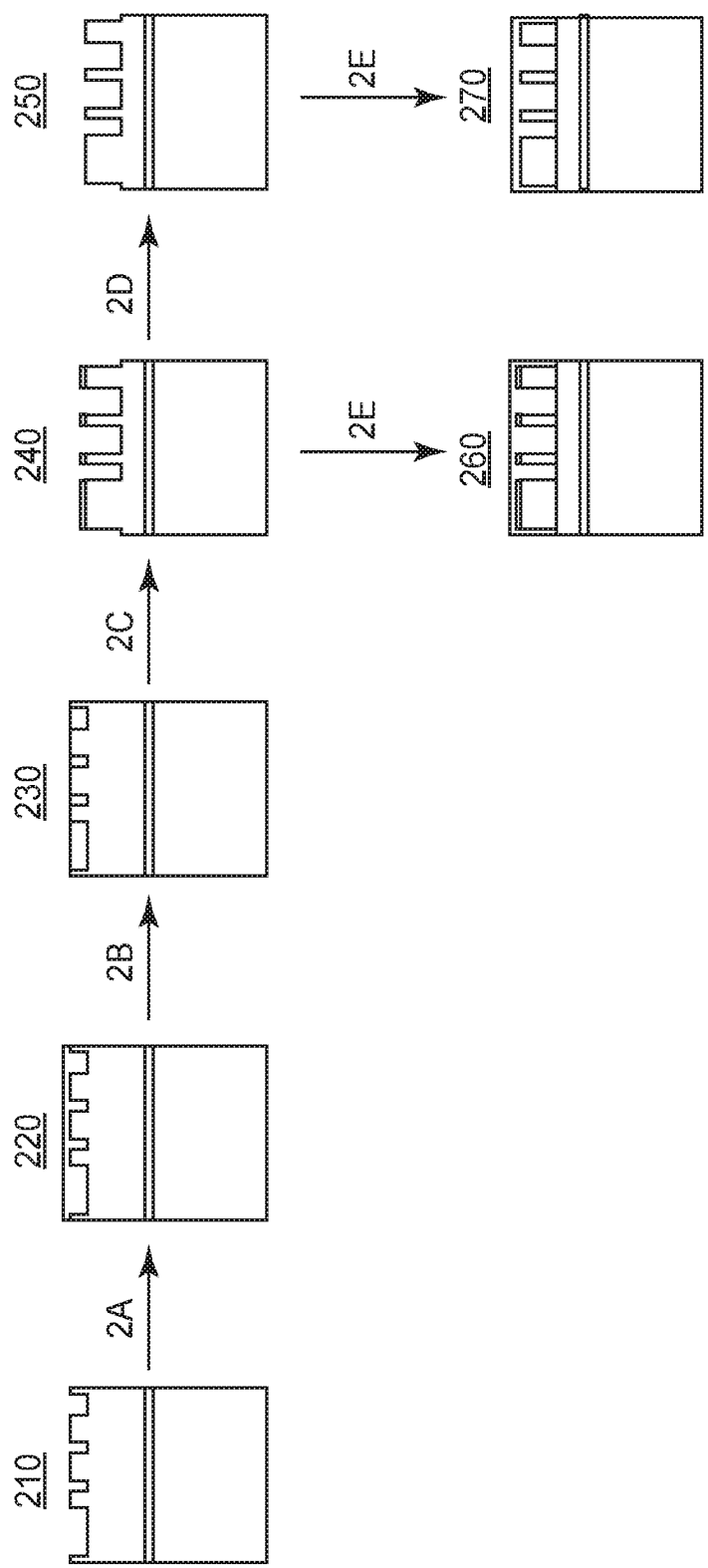
FIG. 5 illustrates a single replicated resist layer with precision land and etch stop layer.

Route 2, shown in FIG. 5, is a variant of Route 1 in which the input roll for the nanoreplication process comprises a polymeric support film and an etch stop layer. Since the construction is etched through the entire land thickness, the land thickness ultimately defines the feature height in the final article. Therefore, the process requires a replicated resist layer with precision land and is useful if the feature height uniformity of the surface features in the final article is critical (e.g., for optical metasurface applications).

A nanoreplicated film comprising a polymeric support film, a nanoreplicated resist layer with precision land, and an etch stop layer 210 is coated with an etch resist layer so that layer covers and substantially planarizes the surface features of the nanoreplicated resin layer (process 2A, "minimal land resist coating"). Planarized nanoreplicated film 220 is etched in a reactive ion etch (RIE) process until the land has been removed and the top surface of the nanoreplicated surface features have been exposed (process 2B, "breakthrough etch"). Zero land resist coated nanoreplicated film 230 is etched in a second RIE process using a second etch chemistry until the etch stop layer is reached, leaving some resist residue at the top of each feature (process 2C). Etched nanopatterned film with residue 240 can be either planarized with a high refractive index backfill to form embedded nanopatterned optical film 260 (process 2E) or subjected to different etch conditions to remove the etch resist residue to form unfilled nanopatterned optical film 250 (process 2D). Finally, unfilled nanopatterned optical film 250 can be planarized with a high refractive index backfill to form embedded nanopatterned optical film 270.

Route 3. Near Zero Land Resist Layer with Precision Pattern Transfer Layer.

Figure 6:
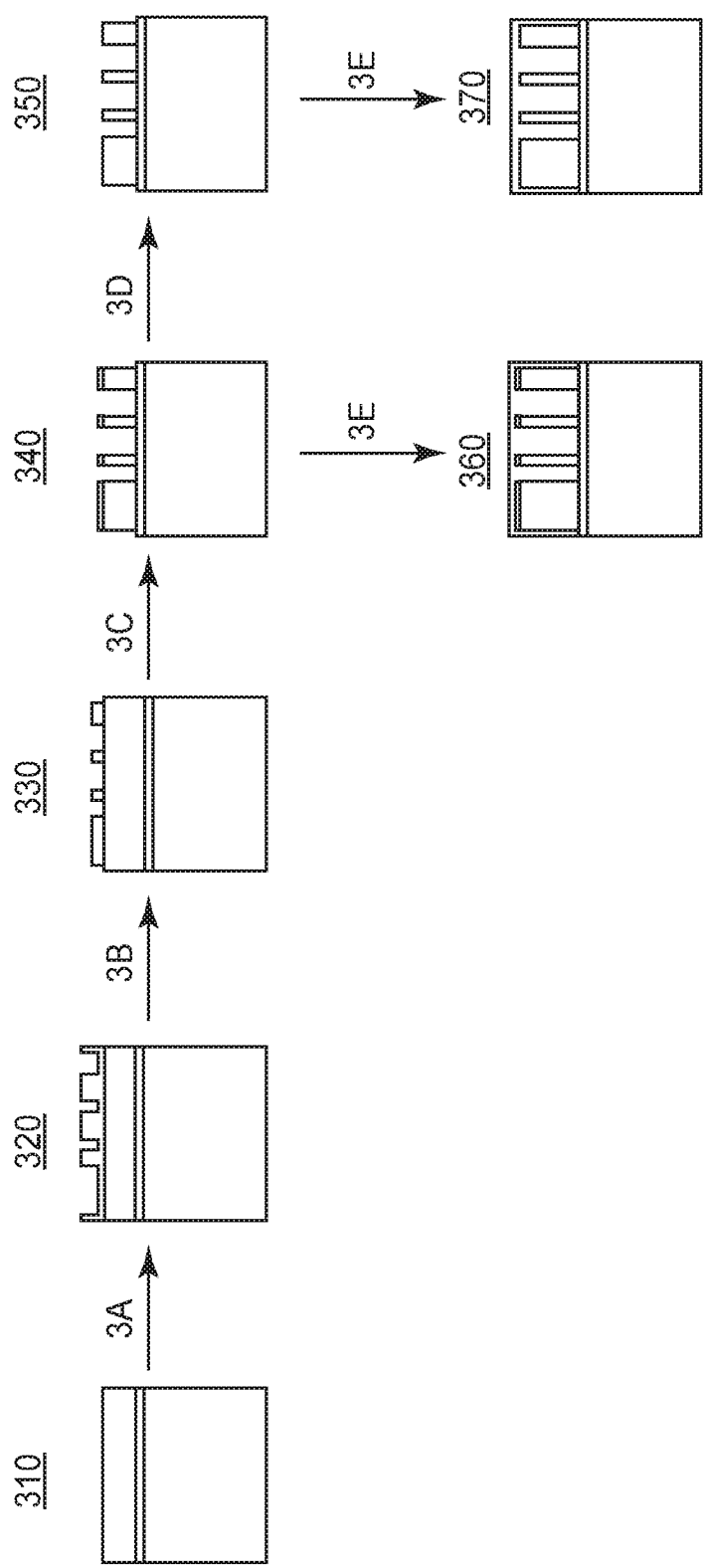
FIG. 6 illustrates a near zero land resist layer with precision pattern transfer layer.

Route 3, shown in FIG. 6, represents the most direct route for roll-to-roll fabrication of nanopatterned optical films with uniform features having an absolute height value. It utilizes an input roll for the nanoreplication process comprising a polymeric support film, a precision pattern transfer layer, and an etch stop layer. It requires a process such as roll-to-roll nanoimprint lithography (R2R NIL) to form a near zero land structured etch resist layer in the first process step. Since the construction is etched through the entire pattern transfer layer thickness, the layer thickness ultimately defines the feature height in the final article. The process is useful if both the feature height uniformity and the absolute feature height of the surface features in the final article is critical (e.g., for optical metasurface applications).

The material used for the pattern transfer layer may end up as either the low or high refractive index material in the embedded optical element.

A film comprising a polymeric support film, a precision pattern transfer layer, and an etch stop layer 310 is utilized as the input roll for a R2R NIL process (process 3A, "R2R NIL"). Nanoreplicated film 320 is etched in a reactive ion etch (RIE) process until the land has been removed and the top surface of the pattern transfer layer has been exposed (process 3B, "breakthrough etch"). Resist coated nanoreplicated film 330 is further etched in a second RIE process using a second etch chemistry until the etch stop layer is reached, leaving some resist residue at the top of each feature (process 3C). Etched nanopatterned film with residue 340 can be either planarized with a high refractive index backfill to form embedded nanopatterned optical film 360 (process 3E) or subjected to different etch conditions to remove the etch resist residue to form unfilled nanopatterned optical film 350 (process 3D). Finally, unfilled nanopatterned optical film 350 can be planarized with a high refractive index backfill to form embedded nanopatterned optical film 370.

Route 4. Replicated Resist Layer with Near Zero Land and Precision Pattern Transfer Layer.

Figure 7:
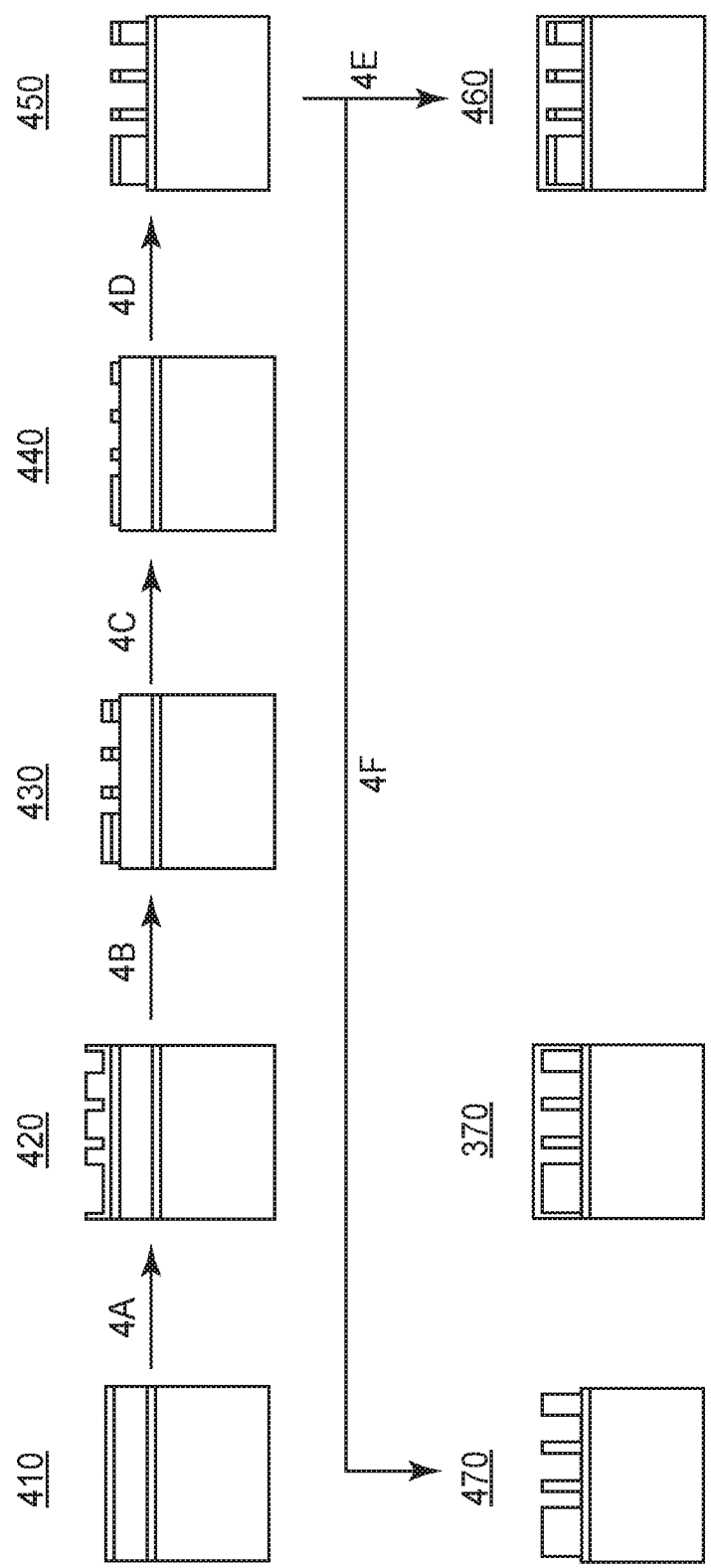
FIG. 7 illustrates a replicated resist layer with near zero land and precision pattern transfer layer.

Route 4, shown in FIG. 7, utilizes a hard mask layer that also functions as a second etch stop layer. The inclusion of a hard mask layer has four beneficial effects. First, it reduces or eliminates the requirement for a near zero land resist replication process since the etch of the thin hard mask layer does not require a high aspect ratio resist feature. Second, the nanoreplicated resist material can be an acrylate resin formulation rather than a silicon-rich hybrid material typically used for R2R NIL. Third, the hard mask etch process enables the formation of deep vias with vertical sidewalls (important for optical metasurface applications). Finally, the construction allows for the use of a low refractive index pattern transfer layer (e.g., a fluoroacrylate) since the vapor deposition step for the hard mask layer forms a well-adhered layer inorganic layer with good wettability for the nanoreplicated resin layer.

It utilizes an input roll for the nanoreplication process comprising a polymeric support film, and an etch stop layer, a precision pattern transfer layer, and a hard mask layer. It requires a process such as roll-to-roll nanoimprint lithography (R2R NIL) to form a near zero land structured etch resist layer in the first process step, but the land control can be relaxed. Since the construction is etched through the entire pattern transfer layer thickness, the layer thickness ultimately defines the feature height in the final article. The process is useful if both the feature height uniformity and the absolute feature height of the surface features in the final article is critical (e.g., for optical metasurface applications) and embedded optical elements with a low refractive index organic layer and a higher refractive index metal oxide backfill layer.

The material used for the pattern transfer layer may be utilized as either the low or high refractive index material in the embedded optical element.

A film comprising a polymeric support film, an etch stop layer, a precision pattern transfer layer, and a hard mask layer 410 is utilized as the input roll for a R2R NIL or continuous cast and cure (process 4A, "R2R NIL"). Nanoreplicated film 420 is etched in a reactive ion etch (RIE) process until the top surface of the hard mask layer has been exposed (process 4B, "breakthrough etch") to produce intermediate 430. Some resin residue may remain after this step and can be removed in an optional additional RIE step (process 4C). Hard mask patterned intermediate 440 is further etched in a second RIE process using a second etch chemistry until the pattern transfer layer is etched through to the etch stop layer (process 4D). Etched nanopatterned film with hard mask residue 450 can be either planarized with a high refractive index backfill to form embedded nanopatterned optical film 460 (process 4E) or subjected to different etch conditions to remove the hard mask residue to form unfilled nanopatterned optical film 470 (process 4F). Finally, unfilled nanopatterned optical film 470 can be planarized with a high refractive index backfill to form embedded nanopatterned optical film 370.

Route 5. Replicated Resist Layer with Uncontrolled Land and Precision Pattern Transfer Layer.

Figure 8:
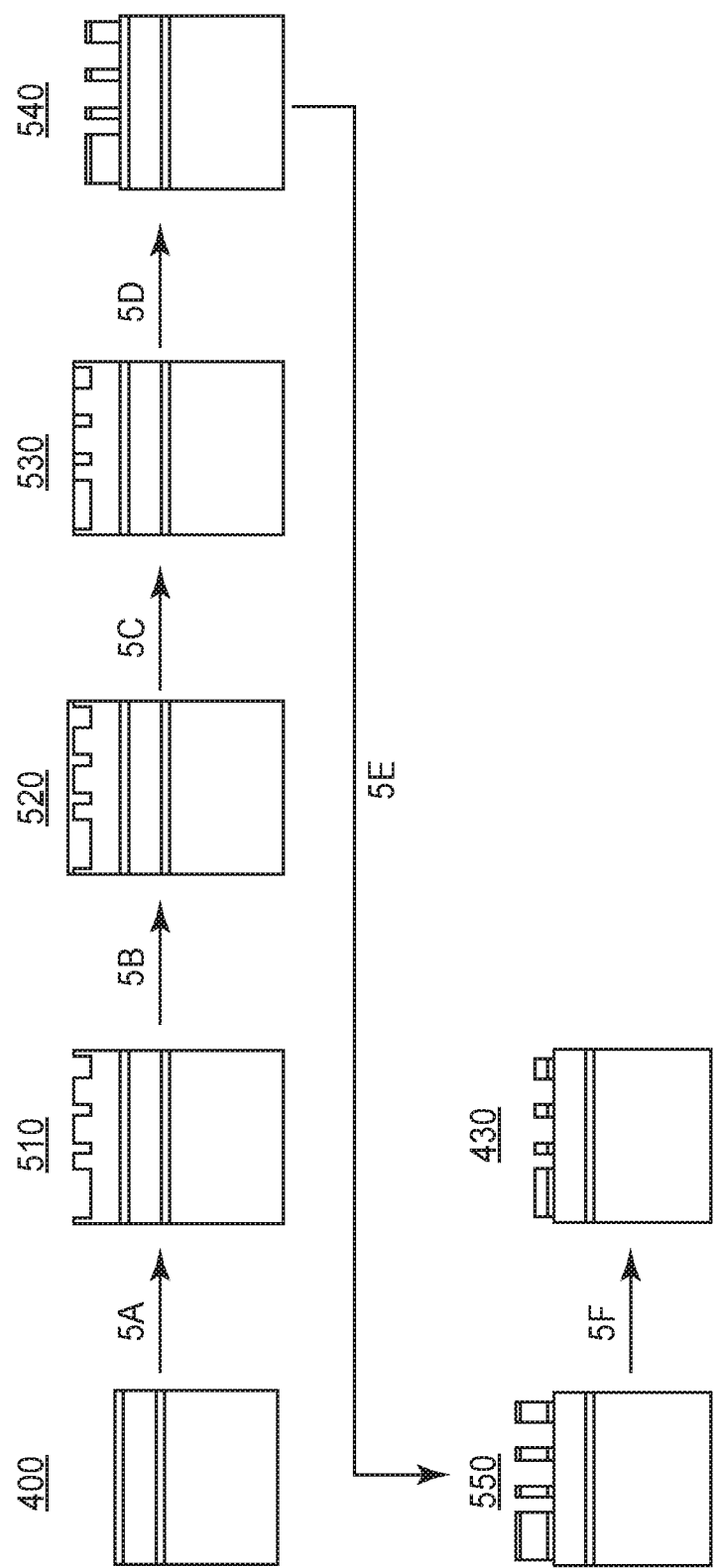
FIG. 8 illustrates a replicated resist layer with uncontrolled land and precision pattern transfer layer.

Route 5, shown in FIG. 8, is based on a combination of strategies from Route 1 (coated etch resist layer) and Route 4 (hard mask layer+pattern transfer layer+etch stop layer). The combination eliminates the requirement for a near zero land resist replication process. Like Route 5, it can produce deep vias with vertical sidewalls and employ the use of a fluoroacrylate pattern transfer layer. However, the benefits come with the expense of additional steps and complexity. FIG. 8 illustrates the unique part of Route 5, which leads to intermediate 430 in Route 4.

It utilizes an input roll for the nanoreplication process comprising a polymeric support film, and an etch stop layer, a precision pattern transfer layer, and a hard mask layer. The nanoreplicated resist can be applied via the continuous cast and cure process since the land control can be relaxed. As with Routes 3 and 4, the construction is etched through the entire pattern transfer layer thickness, the layer thickness ultimately defines the feature height in the final article. The process is useful if both the feature height uniformity and the absolute feature height of the surface features in the final article is critical (e.g., for optical metasurface applications) and embedded optical elements with a low refractive index organic layer and a higher refractive index metal oxide backfill layer.

The material used for the pattern transfer layer may be utilized as either the low or high refractive index material in the embedded optical element.

A film comprising a polymeric support film, an etch stop layer, a precision pattern transfer layer, and a hard mask layer 400 is utilized as the input roll for a continuous cast and cure (process 5A). Nanoreplicated film 510 is coated with an etch resist layer so that layer covers and substantially planarizes the surface features of the nanoreplicated resin layer (process 5B, "minimal land resist coating"). Planarized nanoreplicated film 520 is etched in a reactive ion etch (RIE) process until the land has been removed and the top surface of the nanoreplicated surface features have been exposed (process 5C, "breakthrough etch"). Zero land resist coated nanoreplicated film 530 is etched in an RIE process until the top surface of the hard mask layer has been exposed (process 5D). Hard mask exposed film 540 is then etched until the top surface of the pattern transfer layer has been exposed (process 5D). Hard mask patterned intermediate 540 is further etched in another RIE process using a second etch chemistry until the pattern transfer layer is etched through to the etch stop layer (process 5E). Etched nanopatterned film with hard mask residue 550 can be further etched to remove the residue and form intermediate 430 (process 5F).

Route 6. Replicated Resist Layer with Near Zero Land, Precision Pattern Transfer Layer, and Cladding Layer.

Figure 9:
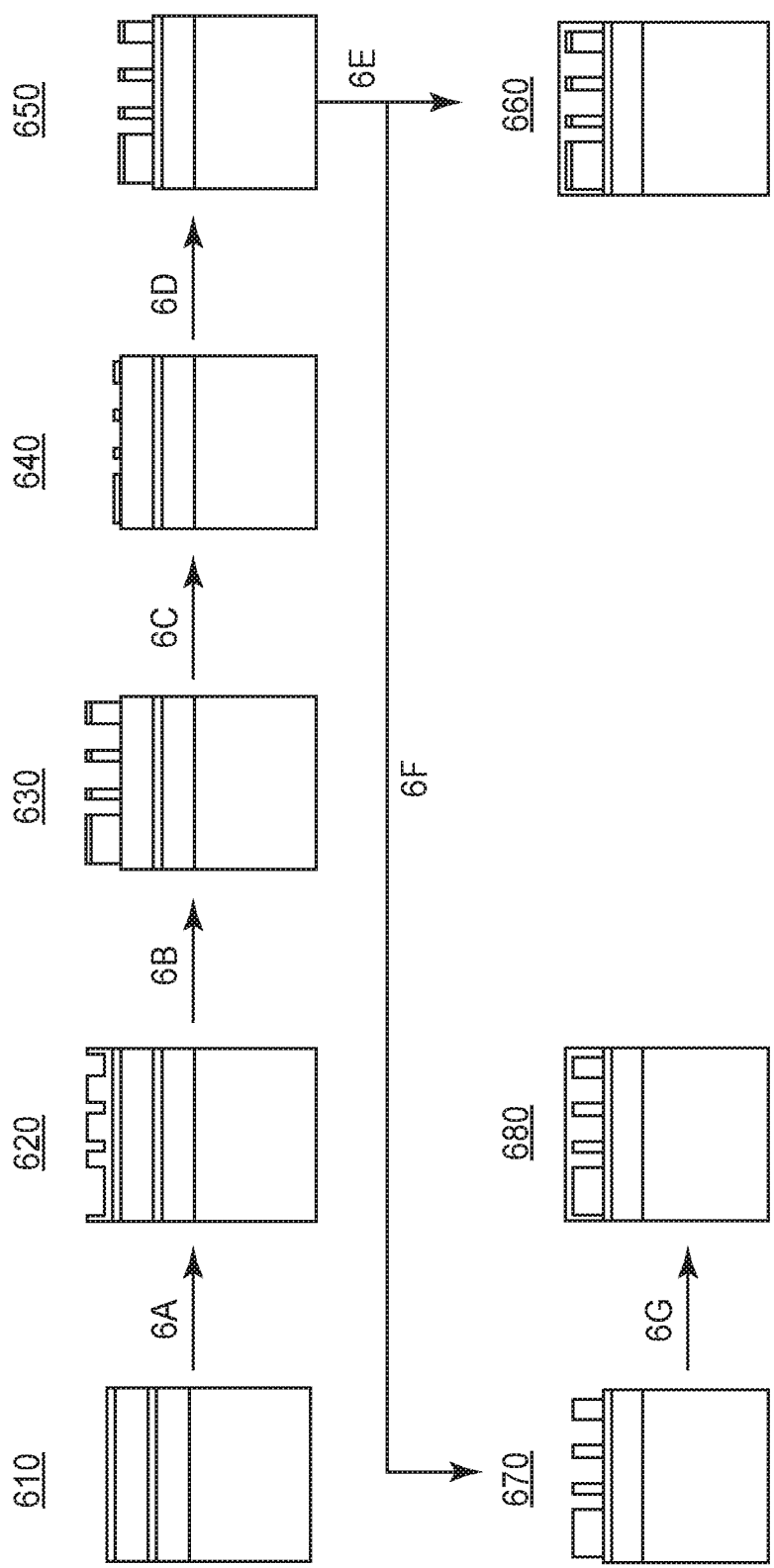
FIG. 9 illustrates a replicated resist layer with near zero land, precision pattern transfer layer, and cladding layer.

Route 6, shown in FIG. 9, is identical to Route 4 except for the addition of a low refractive index cladding layer to the input film 610. The route is useful for the construction of optical films based on dielectric metamaterials, where high refractive index elements ("meta-atoms") are optically isolated by both a lower refractive index precision pattern transfer layer and an additional cladding layer. In most cases, the precision pattern transfer layer and the cladding layer will comprise the same low refractive index materials (e.g., a fluoroacrylate).

A film comprising a polymeric support film, an etch stop layer, a precision pattern transfer layer, a hard mask layer, and a low refractive index cladding layer 610 is utilized as the input roll for a R2R NIL or continuous cast and cure (process 6A, "R2R NIL"). Nanoreplicated film 620 is etched in a reactive ion etch (RIE) process until the top surface of the hard mask layer has been exposed (process 6B, "breakthrough etch") to produce intermediate 630. Some resin residue may remain after this step and can be removed in an optional additional RIE step (process 6C). Hard mask patterned intermediate 640 is further etched in a second RIE process using a second etch chemistry until the pattern transfer layer is etched through to the etch stop layer (process 6D). Etched nanopatterned film with hard mask residue 650 can be either planarized with a high refractive index backfill to form embedded nanopatterned optical film 660 (process 6E) or subjected to different etch conditions to remove the hard mask residue to form unfilled nanopatterned optical film 670 (process 6F). Finally, unfilled nanopatterned optical film 670 can be planarized with a high refractive index backfill to form embedded nanopatterned optical film 680.

In the articles described herein, a layer or element can be adjacent another layer or element by being in direct physical contact with the other layer or element or by being proximate the other layer or element with an intervening layer or element between the adjacent layers or elements.

EXAMPLES

| Materials | | |
|---|---|---|
| Description | Component | Source |
| Etch resist | EVONIK 702 | TEGO ® RC 702, from Evonik in Essen, Germany |
| N-(n-Butyl)-3-aminopropyltrimethoxysilane | Dynasilan 1189 | Evonik in Essen, Germany |
| Urethane acrylate oligomer | PHOTOMER 6010 | BASF, Florham Park, NJ |
| Urethane acrylate oligomer | PHOTOMER 6210 | BASF, Florham Park, NJ |
| Ethoxylated (4) bisphenol A diacrylate | SR601 | Sartomer Americas, Exton, PA |
| Ethoxylated (10) bisphenol A diacrylate | SR602 | Sartomer Americas, Exton, PA |
| (tripropyleneglycoldiacrylate) | SR306HP | |
| Tetrahydrafurfuryl acrylate | SR285 | Sartomer Americas, Exton, PA |
| 1,6-Hexandiol diacrylate | SR238 | Sartomer Americas, Exton, PA |
| Trimethylopropane triacrylate | SR351 | Sartomer Americas, Exton, PA |
| TRICYCLODECANE DIMETHANOL DIACRYLATE | SR833 S | Sartomer Americas, Exton, PA |
| Propoxylated (2) neopentyl glycol diacrylate | SR9003 | Sartomer Americas, Exton, PA |
| (tripropyleneglycoldiacrylate) | SR306HP | Sartomer Americas, Exton, PA |
| 2-Phenoxyethyl acrylate | ETERMER 210 | Toagosei America Inc., West Jefferson, OH |
| Antioxidant | IRGANOX 1035 | BASF, Florham Park, NJ |
| Diphenyl(2,4,6-trimethylbenzoyl)phosphine oxide | IRGACURE TPO | BASF, Florham Park, NJ |
| Methanone, (1-hydroxycyclohexyl)phenyl- | Irgacure 184 | |
| 2-Hydroxy-2-methyl-1-phenyl-propanone | DAROCUR 1173 | BASF, Florham Park, NJ |
| 2-Propenoic Acid, 2-(4-benzoylphenoxy) ethyl ester (disclosed in U.S. Pat. No. 4,847,137) | AEBP | 3M Company, St Paul, MN |
| Solvent | Toluene | Sigma-Aldrich, Milwaukee, WI |
| Solvent | Methanol | Sigma-Aldrich, Milwaukee, WI |
| Solvent | Ethyl Acetate | Sigma-Aldrich, Milwaukee, WI |
| Solvent | methyl ethyl ketone | Sigma-Aldrich, Milwaukee, WI |
| 2-(3-trimethoxysilylpropylcarbamoyloxy)ethyl prop-2-enoate example 7 of U.S. Pat. No. 9,790,396 | K90 | 3M Company, St Paul, MN |
| Hexamethyldisiloxane - PRODUCT CODE: SIH6115.0; CAS NO: 107-46-0 | HMDSO | Gelest, Inc. 11 East Steel Road, Morrisville, PA 19067 |
| MA stands for multi-acrylate in U.S. Pat. No. 7,173,778 | HFPO-MA | 3M Company, St Paul, MN |
| dihydro diol diacrylate disclosed in Column 16 lines 28-67 of U.S. Pat. No. 9,718,961 | HFPO | 3M Company, St Paul, MN |
| | Dowanol PM | THE DOW CHEMICAL COMPANY, MIDLAND MI |
| Photomer 6010, SR602, SR601, SR351, and Etermer 210 were combined in a weight ratio of 60/20/4/8/8 to produce a curable resin. Irgacure TPO and Darocur 1173 were added in respective weight ratios of 0.35 and 0.1 parts per 100 parts of resin. (from U.S. Pat. No. 9,910,192 Example 4) | Compound 01 | 3M Company, St Paul, MN |
| a polymerizable resin made by mixing 0.5% (2,4,6 trimethyl benzoyl) diphenyl phosphine oxide into a 75:25 blend of PHOTOMER 6210 and SR238. Disclosed in US2013/0211310 A1 | Compound 02 | 3M Company, St Paul, MN |

| Material | Description | |
|---|---|---|
| PET film | ST504 | DU PONT TEIJIN FILMS, Hopewell, VA |
| PET film | ST505 | DU PONT TEIJIN FILMS, Hopewell, VA |
| Polycarbonate film | 125 micron thick polycarbonate film with a gloss | Tekra, Inc., New Berlin, WI |

-continued

| Material | Description |
| --- | --- |
| PET-g film | surface finish on both sides obtained from WO2019/032635 |

All concentrations are weight percent

Example 1. Functional Blazed Grating Made by Four-Layer Method with Low-Residual Transfer on PETg All concentrations are percent by weight Step a: Replication of Nano-Featured Template Film.

Figure 10:
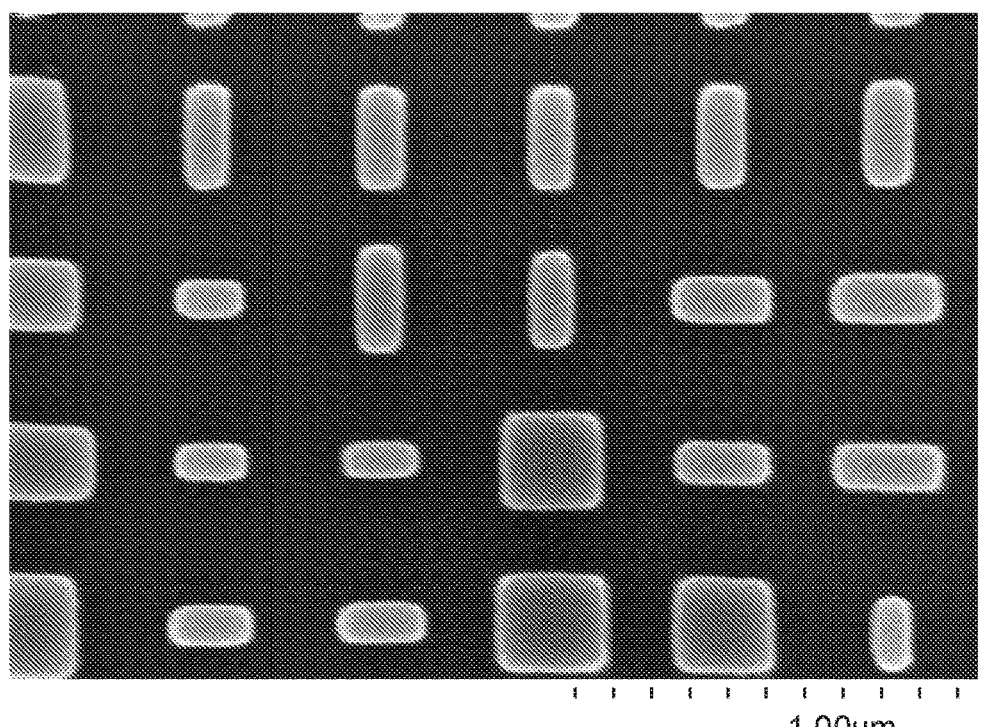
FIGS. 10-26 are images for the Examples.

Compound 01 with 0.5% AEBP was fed through a peristaltic pump into a die and onto a 5 mil polycarbonate film. The resin coated film was nipped against a round nickel sleeve controlled at 140 F which had a nano-scale pattern welded into it. Features ranged from 100 nm-350 nm on a side and were 200 nm tall. Nominally zero vertically draft. While in contact with the nickel sleeve, the resin coated film is exposed to radiation from two Fusion lamps operating at 142 W/cm. The nanostructured film was then peeled from the round nickel sleeve. The process is run continuously at 25 fpm for over 1000 feet. FIG. 10 is a 50 kX top view image of replicated features on the nanoreplicated resist-transfer film and shows a sample area.

Step b: Release Treatment of Nano-Featured Template Film.

Figure 11:
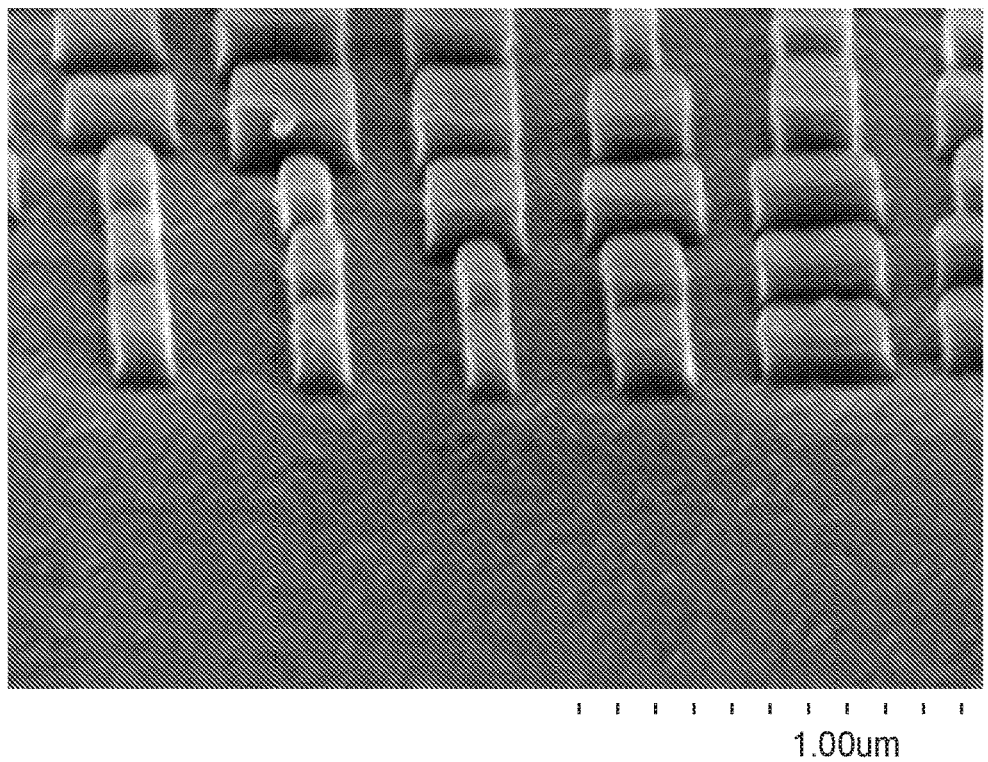

Tooling film from step (a) was release treated using PECVD. First the film was primed by flowing O2 into the chamber at 500 cfpm at 2000 W plasma power at 30 fpm. The film was then treated with HMDSO at 1000 Watts at 30 fpm. FIG. 11 is a 50 kX perspective view image of release-treated replicated features.

Step c: Coat Acrylate onto Template Film.

The release treated tooling film (b) was die coated with a solution of 13% Compound 02 1% HFPO-UA, 43% MEK and 43% Dowanol PM at 10 fpm. The coating is pre-cured with a UV-LED system run at 0.2 Amps within 30 s of coating. A very thin residual layer was desired, so that the residual layer thickness can be controlled to be between zero and 500 nm with jig precision using a premetered coating method. This coating method uses a solution which is at least 50% solvent.

Step d: Drying Acrylate onto Tooling Film.

The solvent was allowed to evaporate off of the film (c) in a 40 foot free-span. To prevent disturbing the wet film, no heat or convection was used to dry off the solvent.

Step e: Creation of Three-Layer Film (to be Laminated onto the Acrylate Coated Template Film).

As this film will be in the final construction, a PET-g film was chosen, due to its low in-plane birefringence. SiAlOx was deposited by dual-cathode AC reactive sputtering from a 95% Si/5% Al target in a O2/Ar atmosphere at 1.5 mtorr and a plasma power of 16 KW. Coating speed was 16 fpm to achieve a 25 nm thick coating. The acrylate was deposited by the 3M Condor process. A mixture of 88% SR833, 4% K90, and 4% Dynasilan 1189 and 4% Irgacure 184 as the photoinitiator were fed into an evaporator, and steady flow of vapor passed through a coating die to a chilled substrate moving at 8.5 fpm, where the mixture condensed and was immediately cured by either UV or low-voltage ebeam. K90 and Dynasilan were used to promote adhesion between the SiAlOx and the acrylate. The final thickness of the acrylate layer was 1100 nm. Another 25 nm layer of SiAlOx was deposited on top of the acrylate layer in the same manner as the first layer.

Step f: Adhesion Promoter on Top of SiAlOx (to Facilitate Adhesion of Tri-Layer Sandwich to the Low-Land Patterned Acrylate).

7.5 nm of K90 was die coated out of MEK on the SiAlOx at 20 fpm. The solvent was evaporated and the film was annealed at 200 F for 1.5 minutes. The K90 was then cured using a fusion E bulb Step g: Lamination.

Coated tooling film was laminated to SiAlOx+K90 film with a 90 durometer nip and a water-heated roll set at 170 F at 10 fpm. The film was then cured with a 600W fusion H bulb.

Step h: Peeling.

Figure 12:
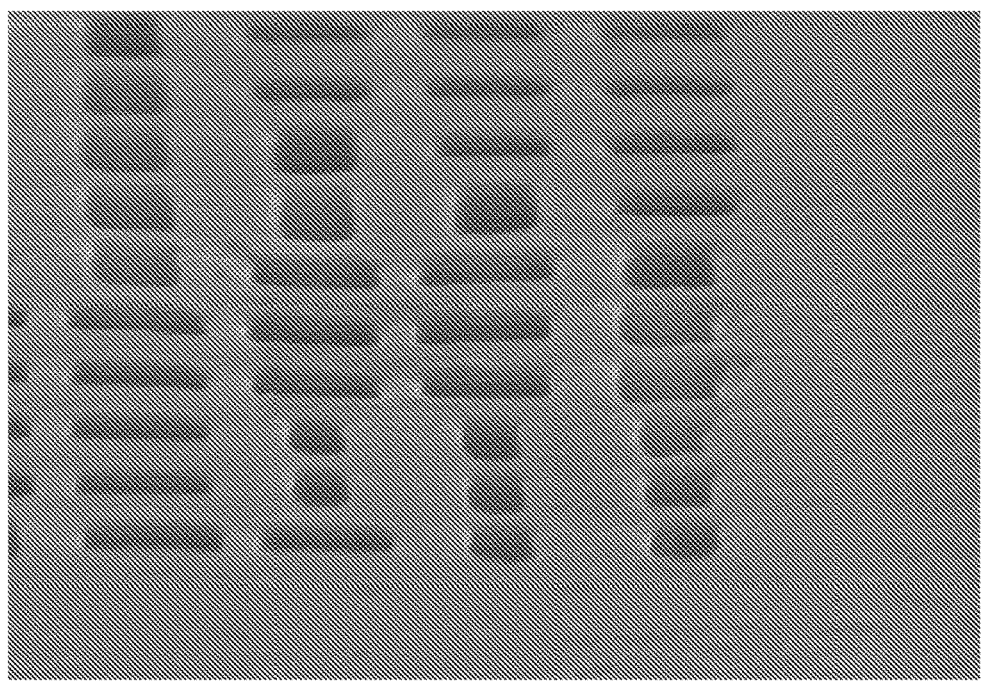
Figure 13:
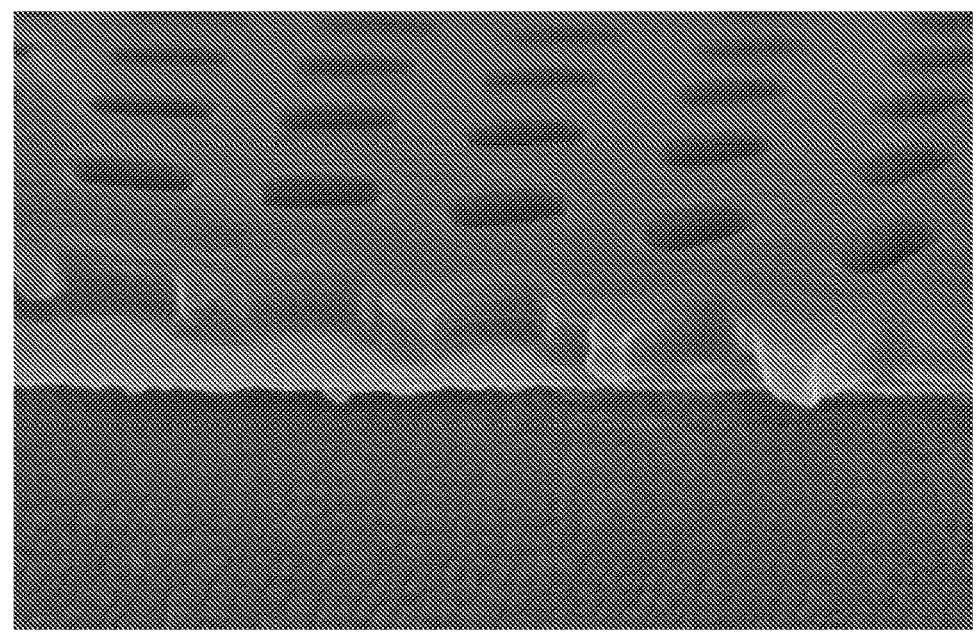

The structured acrylate was peeled from the structured HMDSO film onto the SiAlOx film shortly after the water-heated roll (web twists were minimized to reduce strain). All films were tensioned at approximately 1 pli, still running at 10 fpm. FIG. 12 is a 50 kX perspective view image of structured acrylate peeled onto SiAlOx/Acrylate/SiiAlOx on PETG (the low-land film). FIG. 13 is a 50 kX cross-sectional view image of pre-etch, or pre-breakthrough. Note extremely low residual layer thickness exposed top mask layer in vias.

Steps i and j: Etching Residual Layer and Breakthrough SiAlOx Mask.

These steps can be done either separately, as an oxygen etch followed by a fluorine etch, or subsequently during a single fluorine etch. The latter path was chosen here. In this case, the reactive ion etch was performed with 100 sccm of NF3, at 7500 watts run at 12.5 ft/min at a pressure of 3 mTorr.

Step k: Break-Through Etch.

Figure 14:
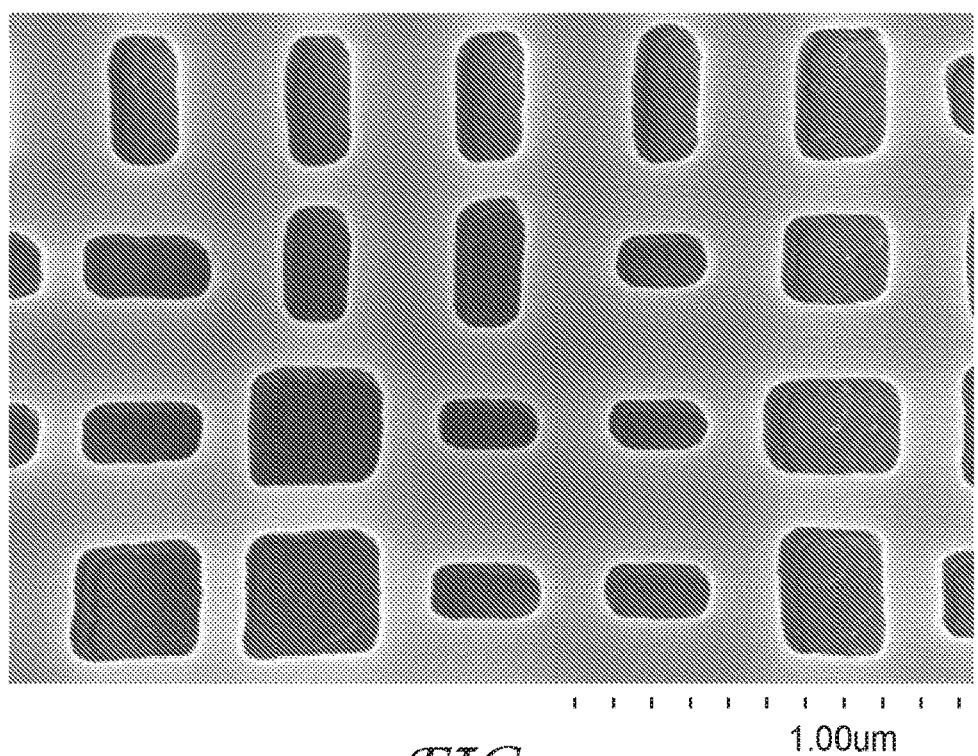
Figure 15:
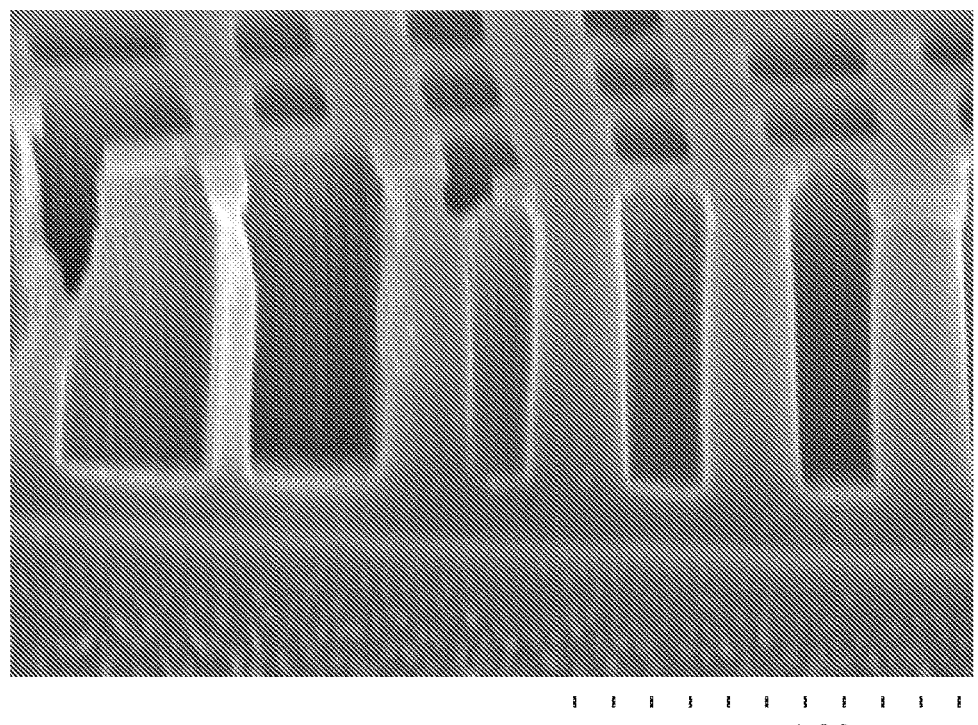

A second reactive ion etch with 700 sccm of O2 at 0.3 mTorr base pressure at 7500 watts run at 15 ft/min at a pressure of 5.2 mTorr removed the transfer layer in the sections where the mask had been removed. FIG. 14 is a 50 kX top view image of the nanolith-patterned film following the break-through etch. FIG. 15 is a 50 kX cross-sectional view image of the post-O2 etch sample.

Step l: High Index Back-Fill.

Figure 16:
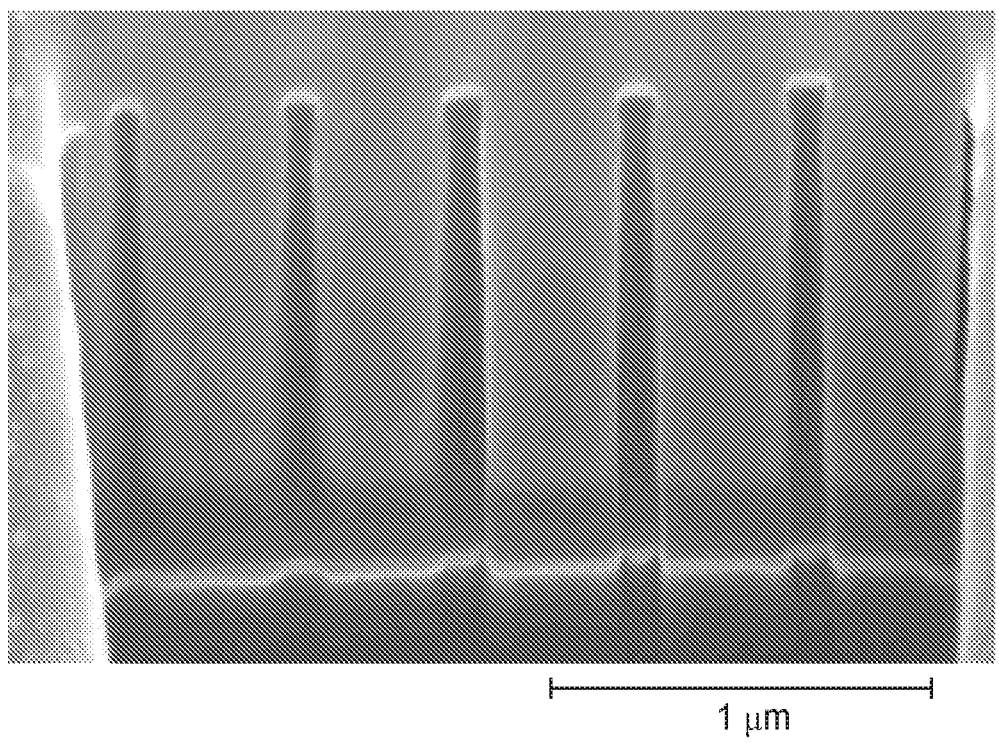

Etched high-aspect ratio features was processed in a spatial rotary ALD machine. TiO2 was deposited using titanium tetraisopropoxide (TTIP) heated to 65 C (passive delivery), and a DC plasma discharge (350 mA) in an environment of 1 ton N2 and 0.3 ton O2. The chamber and substrate were heated to 80 C. The substrate was secured to a platen rotating at 30 RPM, with one precursor and plasma exposure per revolution, for a total of 4688 ALD cycles to yield a TiO2 layer 217-nm in thickness, and having a refractive index of 2.33, measured at a wavelength of 632 nm. FIG. 16 is a 50 Kx cross-sectional SEM view image of TiO2 back-filled sample. In this image, the lighter regions are the TiO2, and the darker regions are acrylate resin.

Figure 17:
Figure 18:

Analysis of Optical Images (FIGS. 17 and 18)

Blazed gratings were analyzed using a laser, where the sample was placed between two orthogonal linear polarizers. The blazed grating optical metamaterial sample on PET (DuPont ST504) showed multiple peaks due to in-plane birefringence of \delta n=0.048. The spurious points were eliminated on the non-birefringent PETg sample (FIG. 18). Note that the "fuzzy" spots observed in FIG. 18 result from thermal degradation of the PETg during ALD coating at 100 C.

Example 2: Depositing Acrylate by Vapor Deposition Process

Process Path:

A round tool was used to make a tooling film with a nanostructured pattern.

Figure 19:
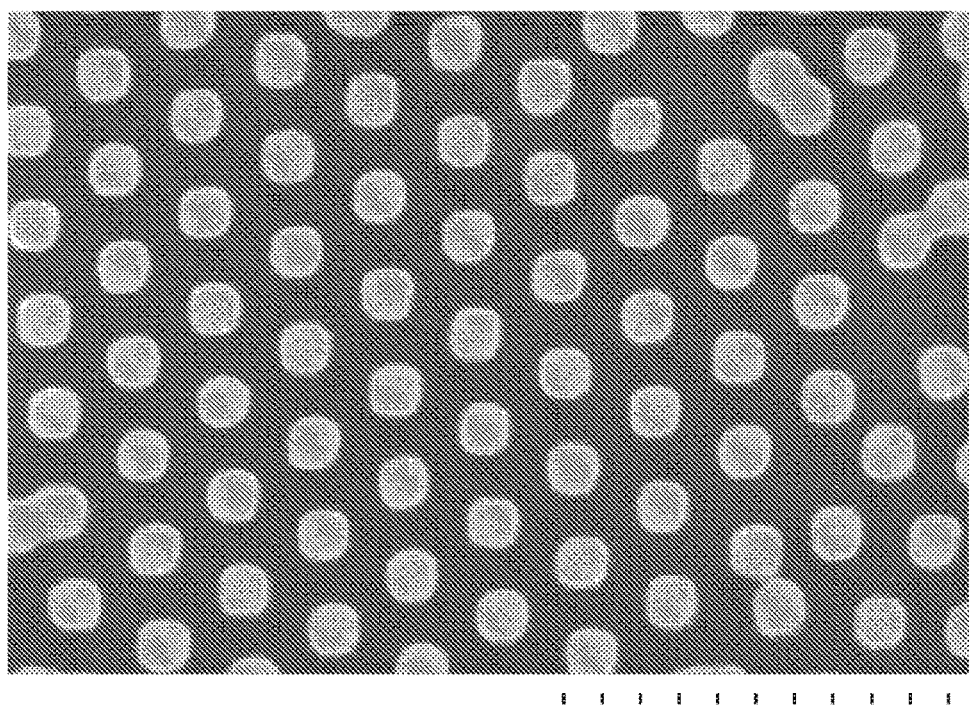
Figure 20:
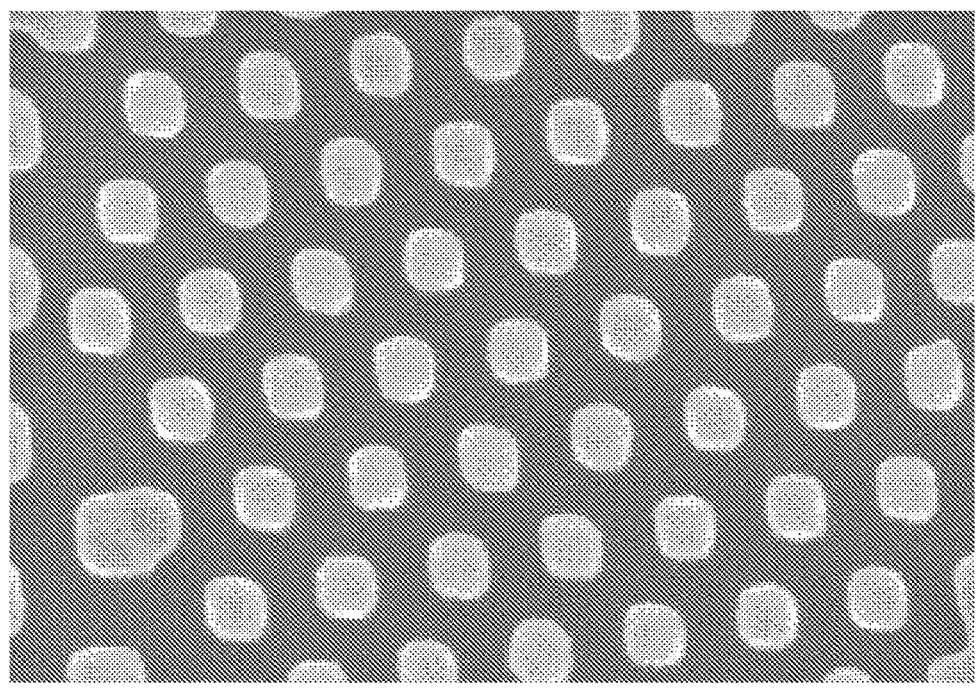
Figure 21:
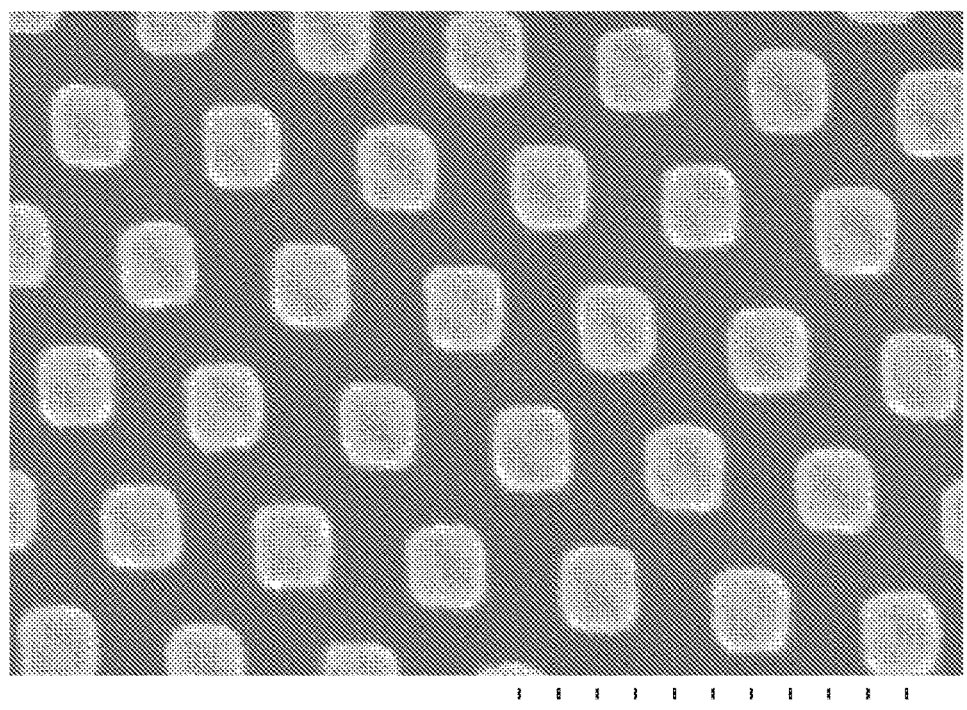

In this example, the tooling film had 12 different nanostructured patterns, which consisted of 200 nm tall pillars, with diameters varying from 100-500 nm at various pitches and spacings, all less than 1 um. Sample SEMs of the different tooling film patches are shown in FIGS. 19-21. FIG. 19 is an image of pattern 9 (small post section), and FIGS. 20 and 21 are images of pattern 9 (large post section).

Step A: Release Treatment of Nano-Featured Template Film.

The nanoreplicated film was release treated using PECVD. First the film was primed by flowing O2 into the chamber at 500 cfpm at 2000 W plasma power at 30 fpm. The film was then treated with HMDSO at 1000 Watts at 30 fpm. A-SR306HP (tripropyleneglycoldiacrylate) is coated 600 nm thick by the vapor deposition process and e-beam cured as described in U.S. Pat. No. 8,658,248.

Step B: Trilayer Coating.

SiAlOx was deposited by dual-cathode AC reactive sputtering from a 95% Si/5% Al target in a O2/Ar atmosphere at 1.5 mtorr and a plasma power of 16 KW. Coating speed was 16 fpm to achieve a 25 nm thick coating. The acrylate was deposited by the 3M Condor process. A mixture of 88% SR833, 4% K90, and 4% Dynasilan 1189 and 4% Irgacure 184 as the photoinitiator were fed into an evaporator, and steady flow of vapor passed through a coating die to a chilled substrate moving at 8.5 fpm, where the mixture condensed and was immediately cured by either UV or low-voltage ebeam. K90 and Dynasilan were used to promote adhesion between the SiAlOx and the acrylate. The final thickness of the acrylate layer was 1100 nm. Another 25 nm layer of SiAlOx was deposited on top of the acrylate layer in the same manner as the first layer.

Step C: Lamination of Polymer Film.

Adhesion promoter on$^{top}$ of SiAlOx: 7.5 nm of K90 was die coated out of MEK on the SiAlOx at 20 fpm; The solvent was evaporated and the film was annealed at 200° F. for 1.5 minutes. The K90 was then cured using a fusion E bulb. A polymerizable resin was made by mixing 0.5% (2,4,6 trimethyl benzoyl) diphenyl phosphine oxide into a 75:25 blend of PHOTOMER 6210 and SR238, as described in US2013/0211310 A1. The resin is was dripped into a rolling back where the film (f) is laminated with a PET film (ST504), then UV cured with fusion H bulb. The thickness here was not premetered, rather it was set by the lamination conditions (40 psi nip pressure, 10 fpm).

Step D: Delamination of the Structured Acrylate Layer.

Figure 22:
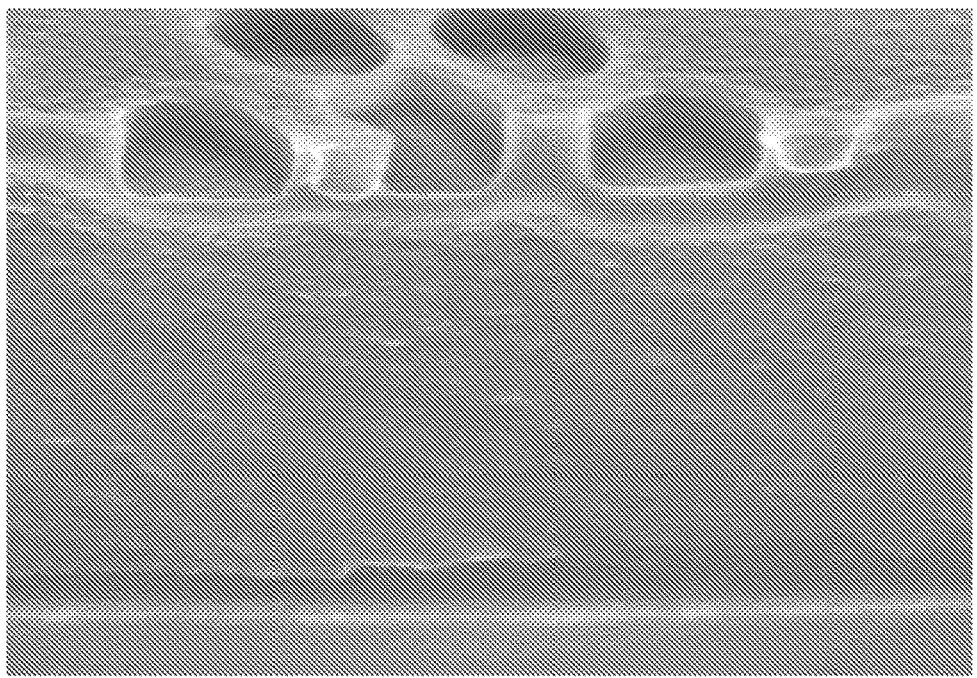

The structured acrylate was peeled along with the three-layer stack onto the top PET film. FIG. 22 is a cross-sectional image showing the SiAlOx on the bottom, the 1100 nm acrylate layer, the top SiAlOx layer, then, on top, the patterned vapor deposited and e-cured deposited layer.

Steps E-F-G: Breakthrough Etch, Transfer Layer Etch were Performed as in Example 1.

Figure 23:
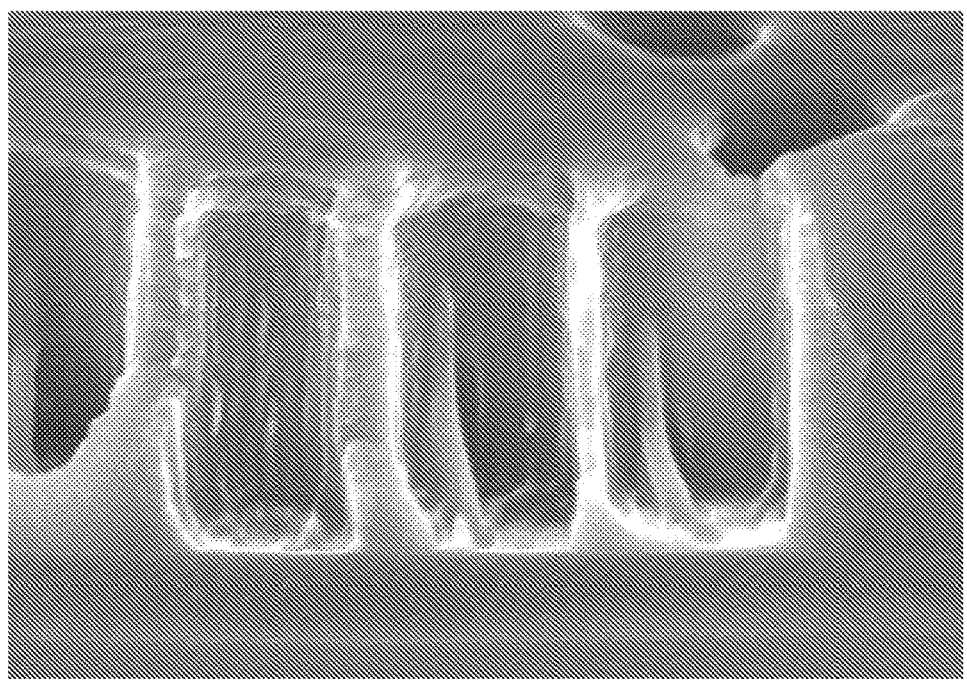

FIG. 23 is a cross-sectional image showing the patterned low index cross-linked acrylate transfer layer.

Example 3: Using HFPO as Transfer Layer

The purpose of the low index material is to increase optical performance by increasing the change in index of refraction between the TiO2 and the embedded resin. In the step B: A fluorinated low-index material, HFPO, was used in place of the 1100 nm acrylate. A PET film was used instead of PETg, although this should be immaterial for processing purposes. 25 nm of SiAlOx were sputtered onto a PET (ST505) film. An approximately 15 nm thick coating of K90 was deposited the SiAlOx by the Vapor deposition. A 1100 nm thick layer of HFPO was deposited on top of the K90 using the condor process on the Falcon coater. A 25 nm SiAlOx layer was sputtered on top of the HFPO.

Figure 24:
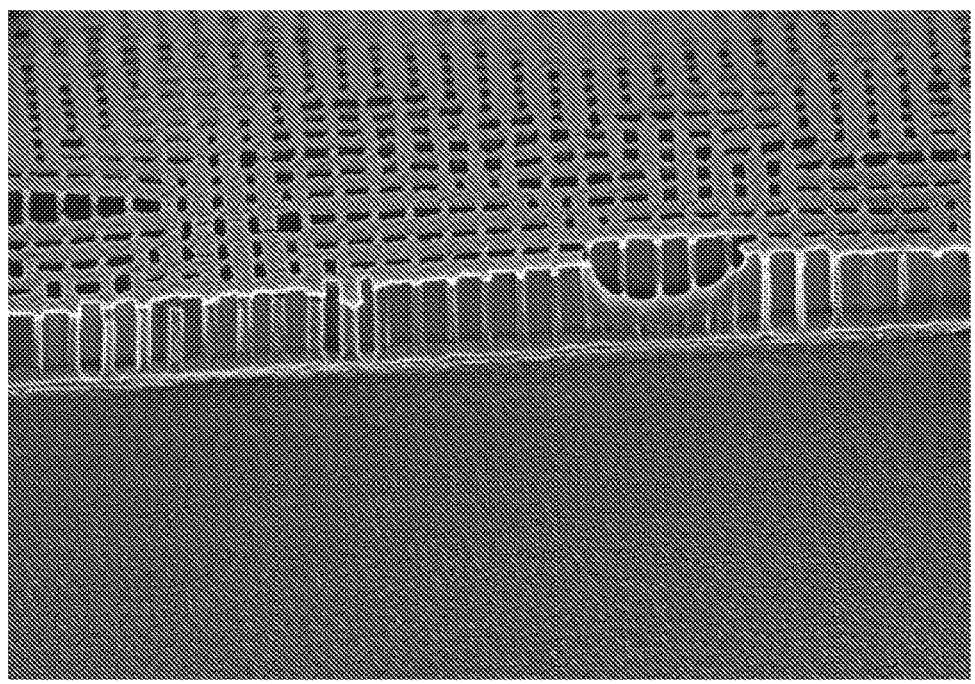
Figure 25:
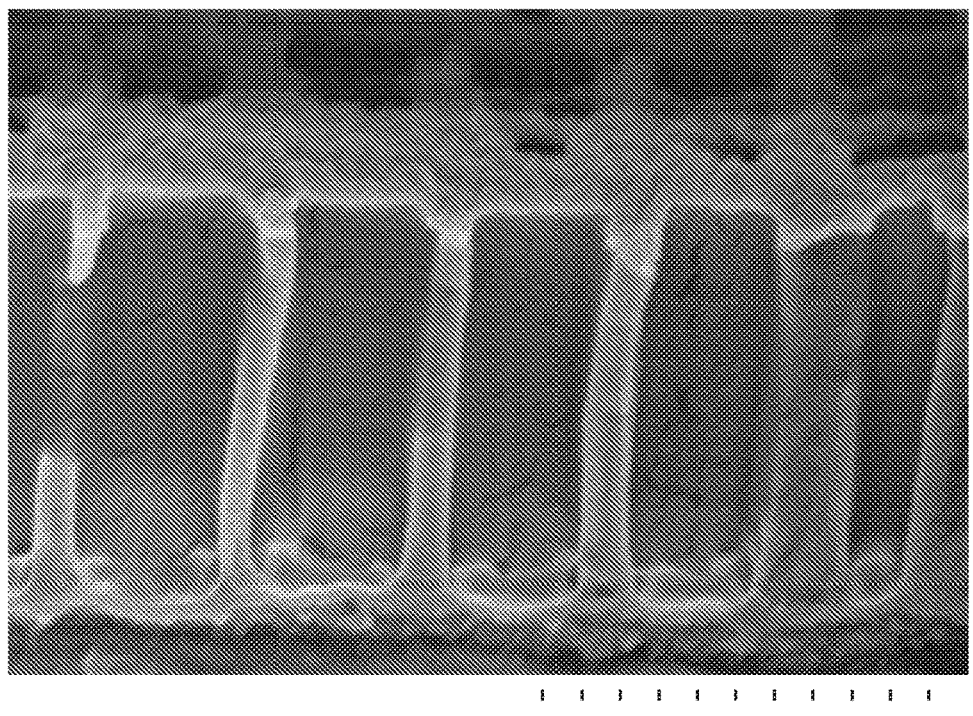

Etching through any land and SiAlOx mask was done in one step: the reactive ion etch was performed with 100 sccm of C6F14 at 0.5 mTorr base pressure, run at 7500 watts at 4 ft/min at a pressure of 6.3 mTorr and a base pressure of 0.5 mTorr. Break-through etch: A second reactive ion etch with 275 sccm of O2 at 0.4 mTorr base pressure at 7500 watts run at 6 ft/min at a pressure of 4.7 mTorr removed the transfer layer in the sections where the mask had been removed. FIG. 24 is a cross-sectional and perspective view image of the array of feature etched in the HFPO layer. FIG. 25 is a close-up cross-sectional view image of the vias etched in the HFPO layer.

Example 4: Coat Acrylate in Three-Layer-Stack Out of Solvent

This Example illustrates how die coating and CVD can be used to make the three-layer stack. Adhesion between layers was shown to be sufficient to with stand delamination.

Steps a-d were performed as described in Example 1. The flow rates for Example 1 were set to give 300 nm dry coating thickness, and for this Example they were set to give 400 nm dry coating thickness Step e: SiCOx was deposited via PECVD onto PET (ST505). (see MMHM010) K90 was solvent coated as described in Example 1, step f. A polymerizable resin made by mixing 0.5% (2,4,6 trimethyl benzoyl) diphenyl phosphine oxide into a 75:25 blend of PHOTOMER 6210 and SR238, as described in US2013/0211310 A1) was diluted to 25 wt % in a mixture of 50/50 MEK/Dowanol PM. The resin was then coated and dried in a 20 foot oven without heat or convection and the final thickness was set to be 1100 nm.

Figure 26:
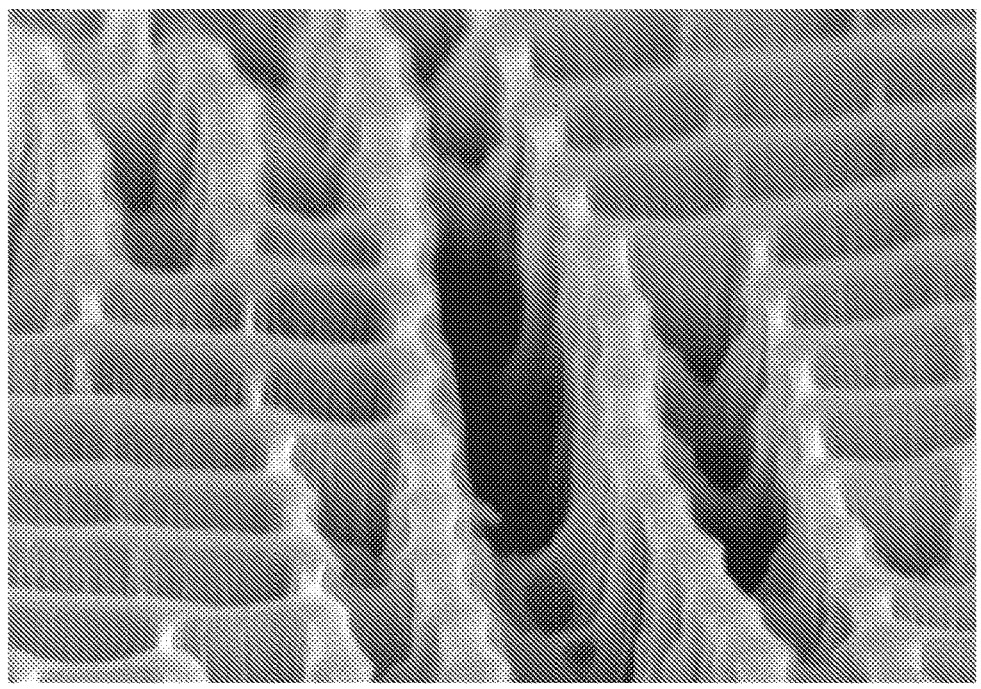

SiCOx was deposited via PECVD. Adhesion promoter on top of SiAlOx, lamination, delamination, etching residual layer and breakthrough SiAlOx mask, and break-through etch were performed as described in Example 1. FIG. 26 is a perspective view image showing features illustrating vias etched in a 1,100 nm thick layer of HFPO.

The invention claimed is:

1. A flexible nanostructured optical film, comprising:
   a pattern transfer layer with first and second major surfaces;
   an etch stop layer adjacent the first major surface of the pattern transfer layer, wherein the etch stop layer comprises a metal, or a metal oxide, or a metal nitride, or a diamond-like glass;
   a hard mask layer adjacent the pattern transfer layer on a side opposite the etch stop layer, wherein the hard mask layer comprises a Si-containing metal oxide, or a diamond-like glass, or a metal; and a nanoreplicated resin layer having a land region and comprising a first surface adjacent the hard mask layer and a second surface further comprising engineered nanostructures characterized by feature dimensions of width, length, and height.

2. The flexible nanostructured optical film of claim 1, wherein the optical film transmits visible or near infrared light.

3. The flexible nanostructured optical film of claim 1, wherein height of the land region of the nanoreplicated resin layer is less than 10 microns.

4. The flexible nanostructured optical film of claim 1, further comprising:

an etch resist layer with a first surface adjacent the second surface of the nanoreplicated resin layer and a second surface, wherein the second surface of the engineered nanostructures of the nanoreplicated resin layer is essentially coplanar with the second surface of the etch resist layer.

5. The flexible nanostructured optical film of claim 4, wherein the etch resist layer comprises organosilicon compounds.

* * * * *